(12) United States Patent
Lu et al.

(10) Patent No.: US 11,362,171 B2
(45) Date of Patent: Jun. 14, 2022

(54) CAPACITOR AND MANUFACTURING METHOD THEREFOR

(71) Applicant: SHENZHEN GOODIX TECHNOLOGY CO., LTD., Shenzhen (CN)

(72) Inventors: Bin Lu, Shenzhen (CN); Jian Shen, Shenzhen (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 17/027,184

(22) Filed: Sep. 21, 2020

(65) Prior Publication Data

US 2021/0005707 A1    Jan. 7, 2021

Related U.S. Application Data

(63) Continuation of application No. PCT/CN2019/094619, filed on Jul. 3, 2019.

(51) Int. Cl.
*H01L 49/02* (2006.01)
*H01L 27/08* (2006.01)

(52) U.S. Cl.
CPC .......... *H01L 28/90* (2013.01); *H01L 27/0805* (2013.01)

(58) Field of Classification Search
None
See application file for complete search history.

(56) References Cited

U.S. PATENT DOCUMENTS

| | | | |
|---|---|---|---|
| 6,570,477 B2 | 5/2003 | Park et al. | |
| 8,487,405 B2 | 7/2013 | Tian et al. | |
| 8,963,287 B1 | 2/2015 | Tian et al. | |
| 9,178,080 B2 * | 11/2015 | Kalnitsky | H01L 29/945 |
| 9,793,340 B2 * | 10/2017 | Voiron | H01L 29/945 |
| 2002/0005541 A1 | 1/2002 | Park et al. | |
| 2012/0211865 A1 * | 8/2012 | Tian | H01L 28/40 |
| | | | 257/532 |
| 2016/0020267 A1 * | 1/2016 | Lin | H01L 29/945 |
| | | | 257/532 |
| 2018/0308638 A1 * | 10/2018 | Ryou | H01G 4/33 |

FOREIGN PATENT DOCUMENTS

| | | |
|---|---|---|
| CN | 102709311 A | 10/2012 |
| CN | 103208415 A | 7/2013 |
| CN | 107204331 A | 9/2017 |
| CN | 108962880 A | 12/2018 |

\* cited by examiner

*Primary Examiner* — Steven M Christopher
(74) *Attorney, Agent, or Firm* — Scully Scott Murphy & Presser

(57) ABSTRACT

A capacitor includes: a semiconductor substrate including at least one substrate trench group; at least one laminated structure, each laminated structure includes n conductive layers and m dielectric layers, the first conductive layer in the n conductive layers is disposed above the semiconductor substrate and in the substrate trench group, the i-th conductive layer in the n conductive layers is provided with the i-th conductive layer trench group, and the (i+1)th conductive layer in the n conductive layers is disposed above the i-th conductive layer and in the i-th conductive layer trench group, where m, n, and i are positive integers, and n≥2, 1≤i≤n−1; a first external electrode connected to some conductive layers; and a second external electrode connected to other conductive layers.

18 Claims, 12 Drawing Sheets

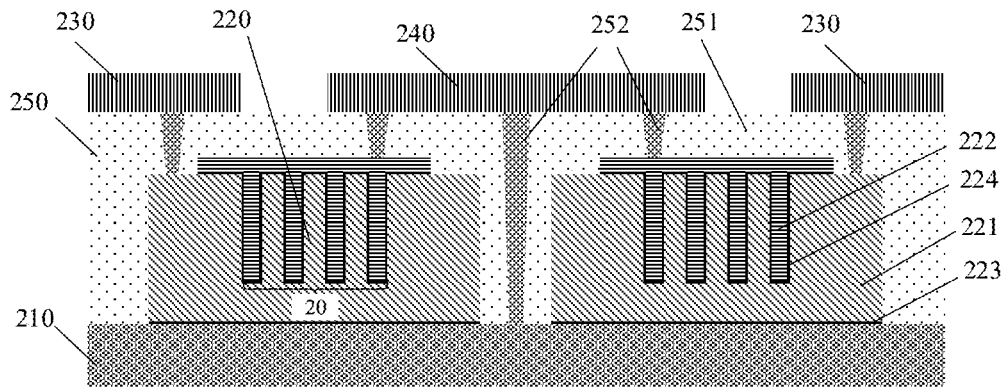

| Producing at least one substrate trench group on a semiconductor substrate, the substrate trench group entering the semiconductor substrate downward from an upper surface of the semiconductor substrate | ~310 |

| Producing at least one laminated structure, each laminated structure including n conductive layers and m dielectric layer(s), where the first conductive layer in the n conductive layers is disposed above the semiconductor substrate and in the substrate trench group, the i-th conductive layer in the n conductive layers is provided with the i-th conductive layer trench group, the i+1-th conductive layer in the n conductive layers is disposed above the i-th conductive layer and in the i-th conductive layer trench group, and the n conductive layers and the m dielectric layer(s) form a structure that a conductive layer and a dielectric layer are adjacent to each other, where m, n, and i are positive integers, and n ≥2, 1≤i≤n-1 | ~320 |

| Producing at least one first external electrode and at least one second external electrode, where the first external electrode is electrically connected to some conductive layer(s) in the n conductive layers, and the second external electrode is electrically connected to other conductive layer(s) in the n conductive layers, and a conductive layer in the laminated structure adjacent to each conductive layer in the some conductive layer(s) includes at least one conductive layer in the other conductive layer(s) | ~330 |

FIG. 13

CAPACITOR AND MANUFACTURING METHOD THEREFOR

CROSS REFERENCE TO RELATED APPLICATIONS

The present disclosure is a continuation of international application No. PCT/CN2019/094619, filed on Jul. 3, 2019, which is hereby incorporated by reference in its entirety.

TECHNICAL FIELD

The present disclosure relates to the field of capacitors, and more particularly, to a capacitor and a manufacturing method therefor.

BACKGROUND

A capacitor can play a role of bypassing, filtering, decoupling, or the like in a circuit, and is an indispensable part to ensure a normal operation of the circuit. With the continuous development of modern electronic systems for multi-function, high integration, low power consumption, and miniaturization, traditional multi-layer ceramic capacitors (MLCC) have been unable to meet the increasingly demanding requirements of small volume and high capacity from application clients. How to manufacture a capacitor with a small volume and a high capacity has become an urgent technical problem to be solved.

SUMMARY

Embodiments of the present disclosure provide a capacitor and a manufacturing method therefor, which can manufacture a capacitor with a small volume and a high capacitance density.

In a first aspect, provided is a capacitor, including:

a semiconductor substrate including at least one substrate trench group, the substrate trench group entering the semiconductor substrate downward from an upper surface of the semiconductor substrate;

at least one laminated structure, each laminated structure including n conductive layers and m dielectric layer(s), where the first conductive layer in the n conductive layers is disposed above the semiconductor substrate and in the substrate trench group, the i-th conductive layer in the n conductive layers is provided with the i-th conductive layer trench group, the (i+1)th conductive layer in the n conductive layers is disposed above the i-th conductive layer and in the i-th conductive layer trench group, and the n conductive layers and the m dielectric layer(s) form a structure that a conductive layer and a dielectric layer are adjacent to each other, where m, n, and i are positive integers, and n≥2, 1≤i≤n−1;

at least one first external electrode, where the first external electrode is electrically connected to some conductive layer(s) in the n conductive layers; and at least one second external electrode, where the second external electrode is electrically connected to other conductive layer(s) in the n conductive layers, and a conductive layer in the laminated structure adjacent to each conductive layer in the some conductive layer(s) includes at least one conductive layer in the other conductive layer(s).

In some possible embodiments, the i-th conductive layer includes a film layer portion and a trench portion, and the i-th conductive layer trench group is disposed in the film layer portion of the i-th conductive layer and does not enter the trench portion of the i-th conductive layer.

In some possible embodiments, a thickness of a film layer portion of the first conductive layer ranges from 10 nm to 20 μm.

In some possible embodiments, numbers and/or sizes of conductive layer trenches included in different conductive layers in the n conductive layers are the same.

In some possible embodiments, numbers and/or sizes of conductive layer trenches included in different conductive layers in the n conductive layers are different.

In some possible embodiments, a plurality of substrate trenches included in the substrate trench group are distributed in an array, and/or a plurality of conductive layer trenches included in the i-th conductive layer trench group are distributed in an array.

In some possible embodiments, sizes of the plurality of substrate trenches included in the substrate trench group are smaller than a first threshold, and/or sizes of the plurality of conductive layer trenches included in the i-th conductive layer trench group are smaller than a second threshold.

In some possible embodiments, the first threshold is equal to the second threshold.

In some possible embodiments, the each laminated structure includes the first conductive layer and a second conductive layer of the n conductive layers, a first dielectric layer and a second dielectric layer of the m dielectric layers, where the first dielectric layer is disposed between the semiconductor substrate and the first conductive layer, and the second dielectric layer is disposed between the first conductive layer and the second conductive layer; and the first conductive layer includes a film layer portion and a trench portion, the first conductive layer is provided with a first conductive layer trench group, and the first conductive layer trench group is disposed in the film layer portion of the first conductive layer and does not enter the trench portion of the first conductive layer, and the second conductive layer is disposed above the first conductive layer and in the first conductive layer trench group.

In some possible embodiments, each laminated structure includes the first conductive layer, a second conductive layer and a third conductive layer of the n conductive layers, a first dielectric layer, a second dielectric layer and a third dielectric layer of the m dielectric layers, where the first dielectric layer is disposed between the semiconductor substrate and the first conductive layer, the second dielectric layer is disposed between the first conductive layer and the second conductive layer, and the third dielectric layer is disposed between the second conductive layer and the third conductive layer;

the first conductive layer includes a film layer portion and a trench portion, the first conductive layer is provided with a first conductive layer trench group, and the first conductive layer trench group is disposed in the film layer portion of the first conductive layer and does not enter the trench portion of the first conductive layer, and the second conductive layer is disposed above the first conductive layer and in the first conductive layer trench group; and the second conductive layer includes a film layer portion and a trench portion, the second conductive layer is provided with a second conductive layer trench group, and the second conductive layer trench group is disposed in the film layer portion of the second conductive layer and does not enter the trench portion of the second conductive layer, and the third conductive layer is disposed above the second conductive layer and in the second conductive layer trench group.

In some possible embodiments, the i-th conductive layer includes a film layer portion and a trench portion, and the i-th conductive layer trench group is disposed in the film layer portion and the trench portion of the i-th conductive layer.

In some possible embodiments, the substrate trench group includes at least one first substrate trench, and the second conductive layer in the n conductive layers is also disposed in the first substrate trench.

In some possible embodiments, a size of the first substrate trench is greater than a third threshold.

In some possible embodiments, the substrate trench group further includes at least one second substrate trench provided around the first substrate trench, and only the first conductive layer in the n conductive layers is disposed in the second substrate trench.

In some possible embodiments, a size of the second substrate trench is smaller than a size of the first substrate trench, and/or a depth of the second substrate trench is smaller than a depth of the first substrate trench.

In some possible embodiments, the each laminated structure includes the first conductive layer and a second conductive layer of the n conductive layers, a first dielectric layer and a second dielectric layer of the m dielectric layers, where the first dielectric layer is disposed between the semiconductor substrate and the first conductive layer, and the second dielectric layer is disposed between the first conductive layer and the second conductive layer; and the first conductive layer includes a film layer portion and a trench portion, the first conductive layer is provided with a first conductive layer trench group, and the first conductive layer trench group is disposed in the film layer portion of the first conductive layer and the trench portion of the first conductive layer, and the second conductive layer is disposed above the first conductive layer and in the first conductive layer trench group.

In some possible embodiments, the laminated structure is provided with a step structure, and the step structure is provided with an etching stop layer formed of an insulating material, or an edge of the step structure is provided with a spacer formed of an insulating material.

In some possible embodiments, the semiconductor substrate is formed of a material with a resistivity less than a threshold, or a surface of the semiconductor substrate is provided with a heavily doped conductive layer or conductive region with a resistivity less than a threshold.

In some possible embodiments, a conductive layer in the laminated structure that is closest to the semiconductor substrate is electrically connected to the first external electrode, and the semiconductor substrate is electrically connected to the second external electrode; or a conductive layer in the laminated structure that is closest to the semiconductor substrate is electrically connected to the second external electrode, and the semiconductor substrate is electrically connected to the first external electrode.

In some possible embodiments, the capacitor further includes: an electrode layer disposed above the laminated structure, where the electrode layer includes at least one first conductive region and at least one second conductive region that are separated from each other, the first conductive region forms the first external electrode, and the second conductive region forms the second external electrode.

In some possible embodiments, the first external electrode and/or the second external electrode is electrically connected to a conductive layer in the n conductive layers through an interconnection structure.

In some possible embodiments, the interconnection structure includes at least one insulating layer and a conductive via structure, and the conductive via structure penetrates through the at least one insulating layer to be electrically connected to a conductive layer in the n conductive layers.

In some possible embodiments, the first external electrode is electrically connected to all odd-numbered conductive layer(s) in the n conductive layers, and the second external electrode is electrically connected to all even-numbered conductive layer(s) in the n conductive layers.

In some possible embodiments, different laminated structures in the at least one laminated structure share the same first external electrode, and/or different laminated structures share the same second external electrode.

In some possible embodiments, the conductive layer includes at least one of:

a heavily doped polysilicon layer, a metal silicide layer, a carbon layer, a conductive polymer layer, an aluminum layer, a copper layer, a tungsten layer, a titanium layer, a tantalum layer, a platinum layer, a nickel layer, a ruthenium layer, an iridium layer, a rhodium layer, a tantalum nitride layer, a titanium nitride layer, a titanium aluminum nitride layer, a tantalum silicon nitride layer, or a tantalum carbon nitride layer.

In some possible embodiments, the dielectric layer includes at least one of:

a silicon oxide layer, a silicon nitride layer, a silicon oxynitride layer, a metal oxide layer, a metal nitride layer, or a metal oxynitride layer.

In a second aspect, provided is a method for manufacturing a capacitor, including:

producing at least one substrate trench group on a semiconductor substrate, the substrate trench group entering the semiconductor substrate downward from an upper surface of the semiconductor substrate;

producing at least one laminated structure, each laminated structure including n conductive layers and m dielectric layer(s), where the first conductive layer in the n conductive layers is disposed above the semiconductor substrate and in the substrate trench group, the i-th conductive layer in the n conductive layers is provided with the i-th conductive layer trench group, the (i+1)th conductive layer in the n conductive layers is disposed above the i-th conductive layer and in the i-th conductive layer trench group, and the n conductive layers and the m dielectric layer(s) form a structure that a conductive layer and a dielectric layer are adjacent to each other, where m, n, and i are positive integers, and $n \geq 2$, $1 \leq i \leq n-1$; and producing at least one first external electrode and at least one second external electrode, where the first external electrode is electrically connected to some conductive layer(s) in the n conductive layers, and the second external electrode is electrically connected to other conductive layer(s) in the n conductive layers, and a conductive layer in the laminated structure adjacent to each conductive layer in the some conductive layer(s) includes at least one conductive layer in the other conductive layer(s).

In some possible embodiments, the i-th conductive layer includes a film layer portion and a trench portion, and the i-th conductive layer trench group is disposed in the film layer portion of the i-th conductive layer and does not enter the trench portion of the i-th conductive layer.

In some possible embodiments, a thickness of a film layer portion of the first conductive layer ranges from 10 nm to 20 μm.

In some possible embodiments, numbers and/or sizes of conductive layer trenches included in different conductive layers in the n conductive layers are the same.

In some possible embodiments, numbers and/or sizes of conductive layer trenches included in different conductive layers in the n conductive layers are different.

In some possible embodiments, a plurality of substrate trenches included in the substrate trench group are distributed in an array, and/or a plurality of conductive layer trenches included in the i-th conductive layer trench group are distributed in an array.

In some possible embodiments, sizes of the plurality of substrate trenches included in the substrate trench group are smaller than a first threshold, and/or sizes of the plurality of conductive layer trenches included in the i-th conductive layer trench group are smaller than a second threshold.

In some possible embodiments, the first threshold is equal to the second threshold.

In some possible embodiments, the laminated structure includes a first dielectric layer of the m dielectric layers, the first conductive layer, a second dielectric layer of the m dielectric layers, and a second conductive layer of the n conductive layers, and the producing the laminated structure includes:

depositing the first dielectric layer on the upper surface of the semiconductor substrate and an inner surface of the substrate trench group;

depositing the first conductive layer on an upper surface and an inner surface of the first dielectric layer;

etching the first conductive layer to form a first conductive layer trench group in the first conductive layer, where the first conductive layer trench group is disposed in a film layer portion of the first conductive layer and does not enter a trench portion of the first conductive layer; and depositing the second dielectric layer on an upper surface of the first conductive layer and an inner surface of the first conductive layer trench group; and depositing the second conductive layer on an upper surface and an inner surface of the second dielectric layer.

In some possible embodiments, the i-th conductive layer includes a film layer portion and a trench portion, and the i-th conductive layer trench group is disposed in the film layer portion and the trench portion of the i-th conductive layer.

In some possible embodiments, the substrate trench group includes at least one first substrate trench, and the second conductive layer in the n conductive layers is also disposed in the first substrate trench.

In some possible embodiments, a size of the first substrate trench is greater than a third threshold.

In some possible embodiments, the substrate trench group further includes at least one second substrate trench provided around the first substrate trench, and only the first conductive layer in the n conductive layers is disposed in the second substrate trench.

In some possible embodiments, a size of the second substrate trench is smaller than a size of the first substrate trench, and/or a depth of the second substrate trench is smaller than a depth of the first substrate trench.

In some possible embodiments, the laminated structure includes a first dielectric layer of the m dielectric layers, the first conductive layer of the n conductive layers, a second dielectric of the m dielectric layers layer, and a second conductive layer of the n conductive layers, and the producing the laminated structure includes:

depositing the first dielectric layer on the upper surface of the semiconductor substrate and an inner surface of the substrate trench group;

depositing the first conductive layer on an upper surface and an inner surface of the first dielectric layer;

etching the first conductive layer to form a first conductive layer trench group in the first conductive layer, where the first conductive layer trench group is disposed in a film layer portion and a trench portion of the first conductive layer;

depositing the second dielectric layer on an upper surface of the first conductive layer and an inner surface of the first conductive layer trench group; and depositing the second conductive layer on an upper surface and an inner surface of the second dielectric layer.

In some possible embodiments, the laminated structure is provided with a step structure, and the step structure is provided with an etching stop layer formed of an insulating material, or an edge of the step structure is provided with a spacer formed of an insulating material.

In some possible embodiments, the semiconductor substrate is formed of a material with a resistivity less than a threshold, or a surface of the semiconductor substrate is provided with a heavily doped conductive layer or conductive region with a resistivity less than a threshold.

In some possible embodiments, a conductive layer in the laminated structure that is closest to the semiconductor substrate is electrically connected to the first external electrode, and the semiconductor substrate is electrically connected to the second external electrode; or a conductive layer in the laminated structure that is closest to the semiconductor substrate is electrically connected to the second external electrode, and the semiconductor substrate is electrically connected to the first external electrode.

In some possible embodiments, the producing the at least one first external electrode and the at least one second external electrode includes:

producing an electrode layer above the laminated structure, where the electrode layer includes at least one first conductive region and at least one second conductive region that are separated from each other, the first conductive region forms the first external electrode, and the second conductive region forms the second external electrode.

In some possible embodiments, the method further includes:

producing an interconnection structure so that the first external electrode and/or the second external electrode is electrically connected to a conductive layer in the n conductive layers through the interconnection structure.

In some possible embodiments, the interconnection structure includes at least one insulating layer and a conductive via structure, and the conductive via structure penetrates through the at least one insulating layer to be electrically connected to a conductive layer in the n conductive layers.

In some possible embodiments, the first external electrode is electrically connected to all odd-numbered conductive layer(s) in the n conductive layers, and the second external electrode is electrically connected to all even-numbered conductive layer(s) in the n conductive layers.

In some possible embodiments, different laminated structures in the at least one laminated structure share the same first external electrode, and/or different laminated structures share the same second external electrode.

Therefore, in an embodiment of the present disclosure, a trench capacitor is manufactured separately in a semiconductor substrate and a conductive layer, and a process of manufacturing a single capacitor can be reused, which reduces alignment accuracy requirements of a plurality of conductive layers, and can further improve capacitance density of the capacitor without increasing the process difficulty.

BRIEF DESCRIPTION OF THE DRAWINGS

FIG. 12 is a schematic structural diagram of yet another capacitor according to an embodiment of the present disclosure.

FIG. 13 is a schematic flow chart of a method for manufacturing a capacitor according to an embodiment of the present disclosure.

DESCRIPTION OF EMBODIMENTS

Technical solutions in embodiments of the present disclosure will be described hereinafter in conjunction with the accompanying drawings.

It should be understood that a capacitor of an embodiment of the present disclosure can play a role of bypassing, filtering, decoupling, or the like in a circuit.

The capacitor described in the embodiment of the present disclosure may be a 3D silicon capacitor which is a novel capacitor based on semiconductor wafer processing techniques. Compared with a traditional MLCC (multi-layer ceramic capacitor), the 3D silicon capacitor has advantages of small size, high precision, strong stability, and long lifetime. In a basic processing flow, a 3D structure with a high aspect ratio such as a via, a trench, a pillar, a wall, or the like is required to be first processed on a wafer or a substrate, and then an insulating film and a low-resistivity conductive material are deposited on a surface of the 3D structure to manufacture a lower electrode, a dielectric layer and an upper electrode of the capacitor, sequentially.

Figure 1:
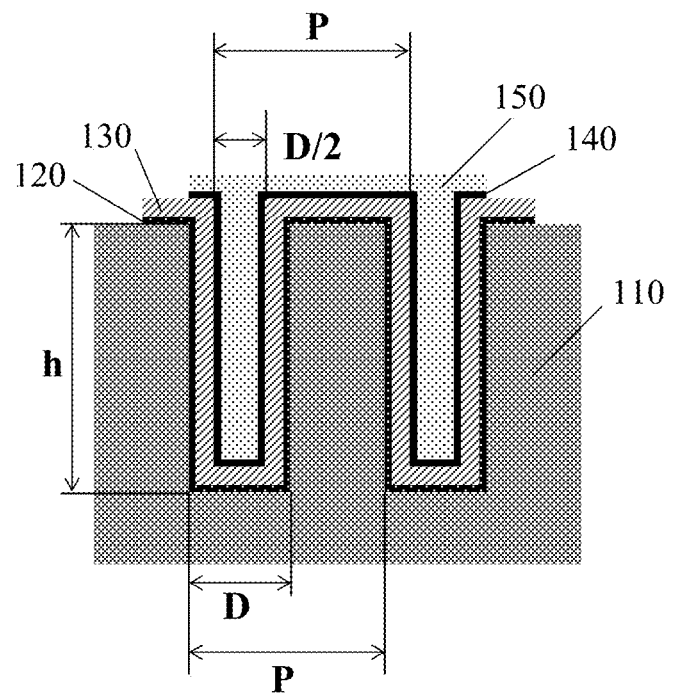
FIG. 1 is a schematic structural diagram of a capacitor provided in the present disclosure.

With the help of advanced semiconductor processing technology, it has become possible to manufacture ultra-thin and highly reliable capacitors. In order to increase capacitance density, the existing 3D silicon capacitor generally adopts a technical solution of stacking multiple layers, as shown in FIG. 1. By manufacturing a plurality of vertically stacked capacitors on a surface of a 3D structure, and then using a metal interconnection structure to connect the plurality of capacitors in parallel, the capacitance density can be effectively improved.

Specifically, as shown in FIG. 1, a substrate 110 is a low-resistivity substrate, the substrate 110 are provided with a trench 1 and a trench 2, and a first dielectric layer 120 is deposited on an upper surface of the substrate 110 and in the trench 1 and the trench 2, a first conductive layer 130 is deposited on upper and inner surfaces of the first dielectric layer 120, a second dielectric layer 140 is deposited on upper and inner surfaces of the first conductive layer 130, and a second conductive layer 150 is deposited on upper and inner surfaces of the second dielectric layer 140.

A capacitance of a capacitor formed by the substrate 110 and the first conductive layer 130 is $C_1$, a capacitance of a capacitor formed by the first conductive layer 130 and the second conductive layer 150 is $C_2$, and a capacitance of an equivalent capacitor formed by the capacitor with capacitance $C_1$ and the capacitor with capacitance $C_2$ connected in parallel is $C_{total}$, where $$C_1 \propto \frac{Dh}{p^2}, C_2 \propto \frac{Dh}{2p^2} \approx \frac{C_1}{2}, C_{total} = C_1 + C_2 = \frac{3}{2}C_1.$$

However, since a plurality of conductive layers need to be deposited in the trench 1 and the trench 2, the trench has a relatively large opening, which results in that the number of trenches per unit area is small, thereby limiting the capacitance. Furthermore, due to geometric effects, a capacitance of a plurality of vertically stacked capacitors gradually decreases, and a capacitance density gain brought by stacking of a plurality of conductive layers is actually limited. In addition, the existing solution is difficult to process, and requires strict control over the uniformity of deposition and etching, as well as precise multilayer alignment. As a result, a product yield is reduced.

In this context, the present disclosure proposes a novel capacitor structure and a method for manufacturing the same, which can improve capacitance density of the capacitor.

Hereinafter, a capacitor according to an embodiment of the present disclosure will be introduced in detail with reference to FIGS. 2 to 12.

It should be understood that capacitors in FIGS. 2 to 12 are merely examples, and the number of laminated structures included in a capacitor is not limited to that included in the capacitors as shown in FIGS. 2 to 12, and may be determined according to actual needs. At the same time, the number of conductive layers and the number of dielectrics included in a laminated structure are just examples, and the number of conductive layers and the number of dielectric layers included in the laminated structure are not limited to those in the capacitors as shown in FIGS. 2 to 12, and can be set flexibly according to actual needs.

It should be noted that, for convenience of understanding, in embodiments shown below, for structures shown in different embodiments, the same structures are denoted by the same reference numbers, and a detailed explanation for the same structure is omitted for brevity.

Figure 2:
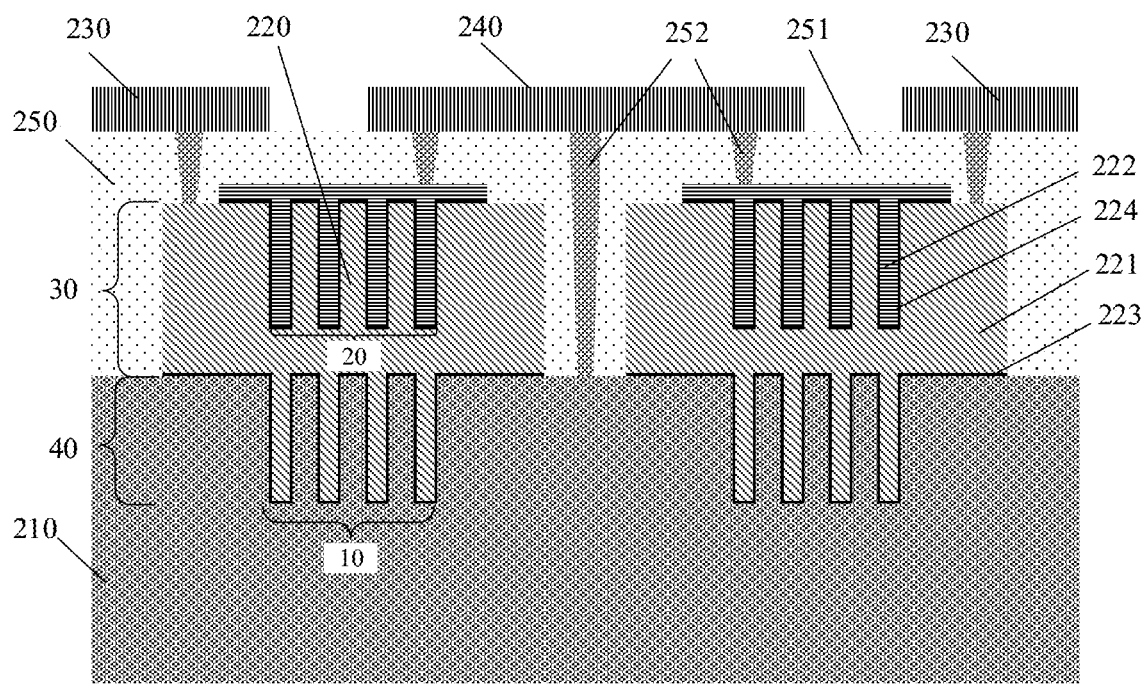
FIG. 2 is a schematic structural diagram of a capacitor according to an embodiment of the present disclosure.

FIG. 2 is a possible structural diagram of a capacitor 200 according to an embodiment of the present disclosure. As shown in FIG. 2, the capacitor 200 includes a semiconductor substrate 210, at least one laminated structure 220, at least one first external electrode 230, and at least one second external electrode 240.

Specifically, as shown in FIG. 2, in the capacitor 200, the semiconductor substrate 210 includes at least one substrate trench group 10, the substrate trench group 10 enters the semiconductor substrate 210 downward from an upper surface of the semiconductor substrate 210; the laminated structure 220 includes n conductive layers and m dielectric layer(s), where the first conductive layer in the n conductive layers is disposed above the semiconductor substrate 210 and in the substrate trench group 10, the i-th conductive layer in then conductive layers is provided with the i-th conductive layer trench group 20, the (i+1)th conductive layer in the n conductive layers is disposed above the i-th conductive layer and in the i-th conductive layer trench group 20, and the n conductive layers and the m dielectric layer(s) form a structure that a conductive layer and a dielectric layer are adjacent to each other, where m, n, and i are positive integers, and n≥2, 1≤i≤n−1; the first external electrode 230 is electrically connected to some conductive layer(s) in the n conductive layers; and the second external electrode 240 is electrically connected to other conductive layer(s) in the n conductive layers, and a conductive layer in the laminated structure adjacent to each conductive layer in the some conductive layer(s) includes at least one conductive layer in the other conductive layer(s).

It should be noted that the substrate trench group 10 may include a plurality of substrate trenches, and the i-th conductive layer trench group 20 may include a plurality of conductive layer trenches.

Optionally, cross-sectional shapes of different substrate trenches in the plurality of substrate trenches in the substrate trench group 10 may be the same or different.

It should be noted that FIG. 2 in the embodiment of the present disclosure is a section along a longitudinal direction of the substrate.

In the embodiment of the present disclosure, depths and widths of the substrate trenches included in the substrate trench group 10 can be flexibly set according to actual needs. Preferably, the substrate trenches included in the substrate trench group 10 have a high aspect ratio. Similarly, depths and widths of the plurality of conductive layer trenches included in the i-th conductive layer trench group 20 can be flexibly set according to actual needs. Preferably, the plurality of conductive layer trenches included in the i-th conductive layer trench group 20 have a high aspect ratio.

It should be noted that, in the embodiment of the present disclosure, the substrate trenches included in the substrate trench group 10 may be holes with a small difference between a length and a width of a cross section, or may be trenches with a large difference between a length and a width, or may be 3D structures like a pillar or a wall. Similarly, the plurality of conductive layer trenches included in the i-th conductive layer trench group 20 may be holes with a small difference between a length and a width of a cross section, or may be trenches with a large difference between a length and a width, or may be 3D structures like a pillar or a wall. Here, the cross section may be understood as a section parallel to the surface of the semiconductor substrate 210, and FIG. 2 shows a section along a longitudinal direction of the semiconductor substrate 210.

In the embodiment of the present disclosure, two adjacent conductive layers in the n conductive layers are electrically isolated by a dielectric layer, and specific values of m and n can be flexibly configured according to actual needs, as long as the two adjacent conductive layers in the n conductive layers are electrically isolated.

For example, when the semiconductor substrate 210 does not participate in forming an electrode plate of the capacitor 200, the first conductive layer in the laminated structure 220 may be directly disposed on the upper surface of the semiconductor substrate 210 and in the substrate trench group 10, that is, n=m+1.

For another example, when the semiconductor substrate 210 participates in forming an electrode plate of the capacitor 200, a dielectric layer needs to be provided between the first conductive layer in the laminated structure 220 and the semiconductor substrate 210 to isolate the first conductive layer and the semiconductor substrate 210, that is, n=m.

It should be understood that the external electrodes in the embodiment of the present disclosure may also be referred to as pads or external pads.

In the embodiment of the present disclosure, a trench capacitor is manufactured separately in a semiconductor substrate and a conductive layer, and a process of manufacturing a single capacitor can be reused, which reduces alignment accuracy requirements of a plurality of conductive layers, and can further improve capacitance density of the capacitor without increasing the process difficulty.

Optionally, in the embodiment of the present disclosure, the semiconductor substrate 210 may be a silicon wafer, including monocrystalline silicon, polycrystalline silicon, or amorphous silicon. The semiconductor substrate 210 may also be other semiconductor substrates, including an SOI wafer or a III-V group compound semiconductor wafer formed of silicon carbide (SiC), gallium nitride (GaN), gallium arsenide (GaAs), or the like, or may be a glass substrate, or may be an organic polymer substrate, or may be a substrate with a surface containing an epitaxial layer, an oxide layer, a doped layer, or a bonding layer.

It should be noted that in the embodiment of the present disclosure, a thickness of the semiconductor substrate 210 can also be flexibly set according to actual needs. For example, when the semiconductor substrate 210 is too thick to meet the requirements, the semiconductor substrate 210 can be thinned.

Optionally, materials of the first external electrode 230 and the second external electrode 240 may be metal, such as copper, aluminum, or the like. The first external electrode 230 and the second external electrode 240 may also include low-resistivity Ti, TiN, Ta, or TaN layers as adhesion layers and/or barrier layers, or may further include some metal layers on surfaces of the external electrodes, for example Ni, Pd (palladium), Au, Sn (tin), or Ag, for subsequent wire bonding or welding processes.

Optionally, in the embodiment of present disclosure, the conductive layer includes at least one of:

a heavily doped polysilicon layer, a metal silicide layer, a carbon layer, a conductive polymer layer, an aluminum layer, a copper layer, a tungsten layer, a titanium layer, a tantalum layer, a platinum layer, a nickel layer, a ruthenium layer, an iridium layer, a rhodium layer, a tantalum nitride layer, a titanium nitride layer, a titanium aluminum nitride layer, a tantalum silicon nitride layer, or a tantalum carbon nitride layer.

That is, a material of the conductive layer in the laminated structure 220 may be heavily doped polysilicon, metal silicide, carbon, conductive polymer, aluminum (Al), tungsten (W), copper (Cu), titanium (Ti), tantalum (Ta), platinum (Pt), ruthenium (Ru), iridium (Ir), rhodium (Rh), nickel (Ni) and other metals, tantalum nitride (TaN), titanium nitride (TiN), titanium aluminum nitride (TiAlN), tantalum silicon nitride (TaSiN), tantalum carbon nitride (TaCN) or other low-resistivity compounds, or a combination or laminated structure of the above materials. A specific conductive material and a layer thickness may be adjusted according to a capacitance, a frequency characteristic, a loss and other requirements of a capacitor. Of course, the conductive layer in the laminated structure 220 may also include some other conductive materials, which is not limited in the embodiment of the present disclosure.

Optionally, in the embodiment of present disclosure, the dielectric layer includes at least one of:

a silicon oxide layer, a silicon nitride layer, a silicon oxynitride layer, a metal oxide layer, a metal nitride layer, or a metal oxynitride layer.

That is, a material of the dielectric layer in the laminated structure 220 may be silicon oxide, silicon nitride, silicon oxynitride, metal oxide, metal nitride, or metal oxynitride, for example, $SiO_2$, SiN, SiON, or high dielectric constant (high-k) materials, including $Al_2O_3$, $HfO_2$, $ZrO_2$, $TiO_2$, $Y_2O_3$, $La_2O_3$, $HfSiO_4$, $LaAlO_3$, $SrTiO_3$, $LaLuO_3$, or the like. The dielectric layer in the laminated structure 220 may be one or more laminated layers, and may be one material or a combination or mixture of a plurality of materials. A specific insulating material and a layer thickness may be adjusted according to a capacitance, a frequency characteristic, a loss and other requirements of a capacitor. Of course, the dielectric layer in the laminated structure 220 may also include some other insulating materials, which is not limited in the embodiment of the present disclosure.

It should be noted that, in the laminated structure 220, an order of the m dielectric layers above the semiconductor substrate 210 is: an order from smallest to largest distance from the semiconductor substrate 210 to the m dielectric layers. Similarly, an order of the n conductive layers above the semiconductor substrate 210 is: an ascending order of a distance from the semiconductor substrate 210.

In the embodiment of the present disclosure, each of the at least one laminated structure 220 may correspond to at least one first external electrode 230 and at least one second external electrode 240.

It should be noted that in the embodiment of the present disclosure, since the first external electrode 230 is electrically connected to some conductive layer(s) in the n conductive layers, the second external electrode 240 is electrically connected to other conductive layer(s) in the n conductive layers, and a conductive layer in the laminated structure 220 adjacent to each conductive layer in the some conductive layer(s) includes at least one conductive layer in the other conductive layer(s). Therefore, for different first external electrodes 230 and second external electrodes 240, the laminated structure 220 can form capacitors with different capacitances.

As an example, it is assumed that the capacitor 200 includes a laminated structure, denoted as a laminated structure 1, and includes two first external electrodes and two second external electrodes, and the two first external electrodes are denoted as a first external electrode A and a first external electrode B, respectively, and the two second external electrodes are denoted as a second external electrode C and a second external electrode D, respectively, and the laminated structure 1 includes five conductive layers and four dielectric layers, the five conductive layers are denoted as a conductive layer 1, a conductive layer 2, a conductive layer 3, a conductive layer 4, and a conductive layer 5, respectively, and the four dielectric layers are denoted as a dielectric layer 1, a dielectric layer 2, a dielectric layer 3, and a dielectric layer 4, respectively.

If the first external electrode A is electrically connected to the conductive layer 1 and the conductive layer 3, the first external electrode B is electrically connected to the conductive layer 1, the conductive layer 3 and the conductive layer 5, the second external electrode C is electrically connected to the conductive layer 2 and the conductive layer 4, and the second external electrode D is also electrically connected to the conductive layer 2 and the conductive layer 4, then for capacitors corresponding to the first external electrode A and the second external electrode C, the conductive layer 1 and the conductive layer 2 form a capacitor 1, and a capacitance is denoted as C1; the conductive layer 2 and the conductive layer 3 form a capacitor 2, and a capacitance is denoted as C2; the conductive layer 3 and the conductive layer 4 form a capacitor 3, and a capacitance is denoted as C3; and the capacitor 1, the capacitor 2 and the capacitor 3 are connected in parallel, and a capacitance of an equivalent capacitor i is denoted as Ci, and thus Ci=C1+C2+C3; and for capacitors corresponding to the first external electrode B and the second external electrode D, the conductive layer 1 and the conductive layer 2 form a capacitor 1, and a capacitance is denoted as C1; the conductive layer 2 and the conductive layer 3 form a capacitor 2, and a capacitance is denoted as C2; the conductive layer 3 and the conductive layer 4 form a capacitor 3, and a capacitance is denoted as C3; the conductive layer 4 and the conductive layer 5 form a capacitor 4, and a capacitance is denoted as C4; and the capacitor 1, the capacitor 2, the capacitor 3 and the capacitor 4 are connected in parallel, and a capacitance of an equivalent capacitor j is denoted as Cj, and thus Cj=C1+C2+C3+C4. Of course, capacitors corresponding to the first external electrode A and the second external electrode D can also form a similar series-parallel structure, and capacitors corresponding to the first external electrode B and the second external electrode C can also form a similar series-parallel structure. Details are not described herein again. Therefore, the laminated structure 1 can form capacitors with different capacitances.

If the first external electrode A is electrically connected to the conductive layer 1 and the conductive layer 5, the first external electrode B is electrically connected to the conductive layer 3 and the conductive layer 5, the second external electrode C is electrically connected to the conductive layer 2 and the conductive layer 4, and the second external electrode D is also electrically connected to the conductive layer 4, then for capacitors corresponding to the first external electrode A and the second external electrode C, the conductive layer 1 and the conductive layer 2 form a capacitor 1, and a capacitance is denoted as C1; the conductive layer 2 and the conductive layer 4 form a capacitor 2, and a capacitance is denoted as C2; the capacitor 1 and the capacitor 2 are connected in parallel, and a capacitance of an equivalent capacitor i is denoted as Ci, and thus Ci=C1+C2; and for capacitors corresponding to the first external electrode B and the second external electrode D, the conductive layer 3 and the conductive layer 4 form a capacitor 3, and a capacitance is denoted as C3; the conductive layer 4 and the conductive layer 5 form a capacitor 4, and a capacitance is denoted as C4; and the capacitor 3 and the capacitor 4 are connected in parallel, and a capacitance of an equivalent capacitor j is denoted as Cj, and thus Cj=C3+C4. Of course, capacitors corresponding to the first external electrode A and the second external electrode D can also form a similar series-parallel structure, and capacitors corresponding to the first external electrode B and the second external electrode C can also form a similar series-parallel structure. Details are not described herein again. Therefore, the laminated structure 1 can form capacitors with different capacitances.

Optionally, each first external electrode 230 in the at least one first external electrode 230 is electrically connected to all odd-numbered conductive layer(s) in the n conductive layers; and each second external electrode 240 in the at least one second external electrode 240 is electrically connected to all even-numbered conductive layer(s) in the n conductive layers. Thus, an effect of increasing capacitance density of a capacitor through a laminated structure can be fully utilized.

As an example, it is assumed that the capacitor 200 includes a laminated structure, denoted as a laminated structure 2, and includes two first external electrodes and two second external electrodes, and the two first external electrodes are denoted as a first external electrode A and a first external electrode B, respectively, and the two second external electrodes are denoted as a second external electrode C and a second external electrode D, respectively, and the laminated structure 2 includes five conductive layers and four dielectric layers, the five conductive layers are denoted as a conductive layer 1, a conductive layer 2, a conductive layer 3, a conductive layer 4, and a conductive layer 5, respectively, and the four dielectric layers are denoted as a dielectric layer 1, a dielectric layer 2, a dielectric layer 3, and a dielectric layer 4, respectively.

If the first external electrode A is electrically connected to the conductive layer 1, the conductive layer 3 and the conductive layer 5, the first external electrode B is also electrically connected to the conductive layer 1, the conductive layer 3 and the conductive layer 5, the second external electrode C is electrically connected to the conductive layer 2 and the conductive layer 4, and the second external electrode D is also electrically connected to the conductive layer 2 and the conductive layer 4, then for capacitors corresponding to the first external electrode A and the second external electrode C, the conductive layer 1 and the conductive layer 2 form a capacitor 1, and a capacitance is denoted as C1; the conductive layer 2 and the conductive layer 3 form a capacitor 2, and a capacitance is denoted as C2; the conductive layer 3 and the conductive layer 4 form a capacitor 3, and a capacitance is denoted as C3; the conductive layer 4 and the conductive layer 5 form a capacitor 4, and a capacitance is denoted as C4; and the capacitor 1, the capacitor 2, the capacitor 3 and the capacitor 4 are connected in parallel, and a capacitance of an equivalent capacitor i is denoted as Ci, and thus Ci=C1+C2+C3+C4; and for capacitors corresponding to the first external electrode B and the second external electrode D, the conductive layer 1 and the conductive layer 2 form a capacitor 1, and a capacitance is denoted as C1; the conductive layer 2 and the conductive layer 3 form a capacitor 2, and a capacitance is denoted as C2; the conductive layer 3 and the conductive layer 4 form a capacitor 3, and a capacitance is denoted as C3; the conductive layer 4 and the conductive layer 5 form a capacitor 4, and a capacitance is denoted as C4; and the capacitor 1, the capacitor 2, the capacitor 3 and the capacitor 4 are connected in parallel, and a capacitance of an equivalent capacitor j is denoted as Cj, and thus Cj=C1+C2+C3+C4. Of course, capacitors corresponding to the first external electrode A and the second external electrode D can also form a similar series-parallel structure, and capacitors corresponding to the first external electrode B and the second external electrode C can also form a similar series-parallel structure. Details are not described herein again.

Optionally, different laminated structures in the at least one laminated structure 220 may share the same first external electrode 230, and/or different laminated structures may share the same second external electrode 240. Of course, different laminated structures in the at least one laminated structure 220 may also not share any external electrode, which is not limited in the embodiment of the present disclosure.

That is, in the embodiment of the present disclosure, a first external electrode 230 may be electrically connected to some or all of the laminated structure 220 in the at least one laminated structure 220. Similarly, a second external electrode 240 may also be electrically connected to some or all of the laminated structure 220 in the at least one laminated structure 220.

As an example, it is assumed that the capacitor 200 includes two laminated structures, a first external electrode P, a second external electrode Q, and a second external electrode Z, and the two laminated structures are denoted as a laminated structure A and a laminated structure B, respectively.

If the first external electrode P is electrically connected to all odd-numbered conductive layer(s) of the laminated structure A and all odd-numbered conductive layer(s) of the laminated structure B, the second external electrode Q is electrically connected to all even-numbered conductive layer(s) of the laminated structure A, and the second external electrode Z is electrically connected to all even-numbered conductive layer(s) of the laminated structure B, then the first external electrode P and the second external electrode Q form an equivalent capacitor 1, and a capacitance is denoted as C1, and the first external electrode P and the second external electrode Z form an equivalent capacitor 2, and a capacitance is denoted as C2.

Optionally, in the embodiment of the present disclosure, the i-th conductive layer includes a film layer portion 30 and a trench portion 40, and the i-th conductive layer trench group 20 is disposed in the film layer portion 30 of the i-th conductive layer and does not enter the trench portion 40 of the i-th conductive layer.

Optionally, in an embodiment, n=2 and m=2, that is, the laminated structure 220 may include two conductive layers such as the first conductive layer 221 and the second conductive layer 222 shown in FIG. 2, and two dielectric layers such as the first dielectric layer 223 and the second dielectric layer 224 shown in FIG. 2. The first dielectric layer 223 is disposed between the semiconductor substrate 210 and the first conductive layer 221, and the second dielectric layer 224 is disposed between the first conductive layer 221 and the second conductive layer 222. As shown in FIG. 2, the first conductive layer 221 includes a film layer portion 30 and a trench portion 40, the first conductive layer 221 is provided with a first conductive layer trench group 20, and the first conductive layer trench group 20 is disposed in the film layer portion 30 of the first conductive layer 221 and does not enter the trench portion 40 of the first conductive layer.

Figure 3:
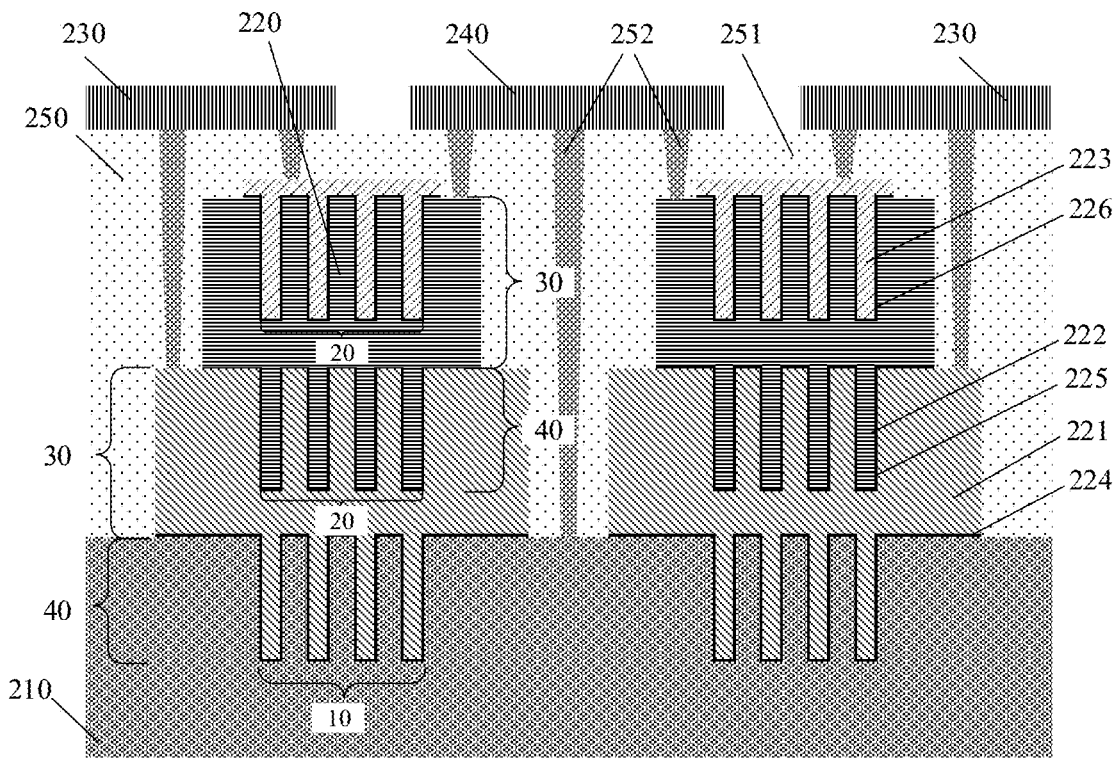
FIG. 3 is a schematic structural diagram of another capacitor according to an embodiment of the present disclosure.

Optionally, in another embodiment, n=3 and m=3, that is, the laminated structure 220 may include three conductive layers such as the first conductive layer 221, the second conductive layer 222 and the third conductive layer 223 shown in FIG. 3, and three dielectric layers such as the first dielectric layer 224, the second dielectric layer 225, and the third dielectric layer 226 shown in FIG. 3. The first dielectric layer 224 is disposed between the semiconductor substrate 210 and the first conductive layer 221, the second dielectric layer 225 is disposed between the first conductive layer 221 and the second conductive layer 222, and the third dielectric layer 226 is disposed between the second conductive layer 222 and the third conductive layer 223. As shown in FIG. 3, the first conductive layer 221 includes a film layer portion 30 and a trench portion 40, the first conductive layer 221 is provided with a first conductive layer trench group 20, and the first conductive layer trench group 20 is disposed in the film layer portion 30 of the first conductive layer 221 and does not enter the trench portion 40 of the first conductive layer; and the second conductive layer 221 includes a film layer portion 30 and a trench portion 40, the second conductive layer 221 is provided with a second conductive layer trench group 20, and the second conductive layer trench group 20 is disposed in the film layer portion 30 of the second conductive layer 221 and does not enter the trench portion 40 of the second conductive layer.

Optionally, in the embodiments shown in FIGS. 2 and 3, a thickness of the film layer portion of the first conductive layer 221 ranges from 10 nm to 20 µm. Optionally, thicknesses of film layer portions of different conductive layers in the n conductive layers may be the same or different. For example, in the n conductive layers, a thickness of the first conductive layer>a thickness of the second conductive layer> . . . > a thickness of the n-th conductive layer.

Optionally, in the embodiments shown in FIGS. 2 and 3, numbers and/or sizes of conductive layer trenches included in different conductive layers in the n conductive layers are the same. Of course, numbers and/or sizes of conductive layer trenches included in different conductive layers in the n conductive layers may also be different.

Optionally, in the embodiments shown in FIGS. 2 and 3, a plurality of substrate trenches included in the substrate trench group 10 are distributed in an array, and/or a plurality of conductive layer trenches included in the i-th conductive layer trench group 20 are distributed in an array.

Optionally, in the embodiments shown in FIGS. 2 and 3, sizes of the plurality of substrate trenches included in the substrate trench group 10 are smaller than a first threshold, and/or sizes of the plurality of conductive layer trenches included in the i-th conductive layer trench group 20 are smaller than a second threshold.

Optionally, the first threshold is equal to the second threshold, for example, the first threshold may be 1 µm, and the second threshold may also be 1 µm. Therefore, the plurality of substrate trenches and the plurality of conductive layer trenches may use the same etching parameters to reduce the difficulty of manufacturing a capacitor.

Of course, the first threshold may also be greater than or smaller than the second threshold, that is, the plurality of substrate trenches may be individually set with etching parameters.

Optionally, in the embodiment of the present disclosure, the i-th conductive layer includes a film layer portion 30 and a trench portion 40, and the i-th conductive layer trench group 20 is disposed in the film layer portion 30 and the trench portion 40 of the i-th conductive layer.

Figure 4:
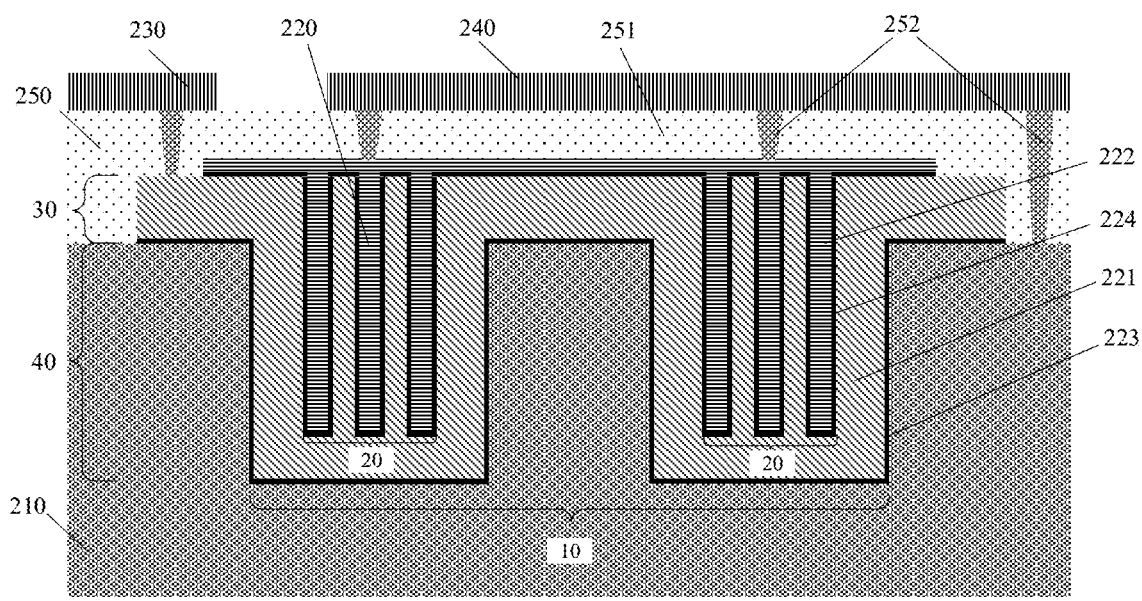
FIG. 4 is a schematic structural diagram of yet another capacitor according to an embodiment of the present disclosure.

Optionally, in an embodiment, n=2 and m=2, that is, the laminated structure 220 may include two conductive layers such as the first conductive layer 221 and the second conductive layer 222 shown in FIG. 4, and two dielectric layers such as the first dielectric layer 223 and the second dielectric layer 224 shown in FIG. 4. The first dielectric layer 223 is disposed between the semiconductor substrate 210 and the first conductive layer 221, and the second dielectric layer 224 is disposed between the first conductive layer 221 and the second conductive layer 222. As shown in FIG. 4, the first conductive layer 221 includes a film layer portion 30 and a trench portion 40, the first conductive layer 221 is provided with a first conductive layer trench group 20, and the first conductive layer trench group 20 is disposed in the film layer portion 30 and the trench portion 40 of the first conductive layer 221.

Optionally, as shown in FIG. 4, the substrate trench group 10 includes at least one first substrate trench 11, and the second conductive layer in the n conductive layers is also disposed in the first substrate trench 11.

Optionally, a size of the first substrate trench is greater than a third threshold. For example, the third threshold may be 100 nm.

Figure 5:
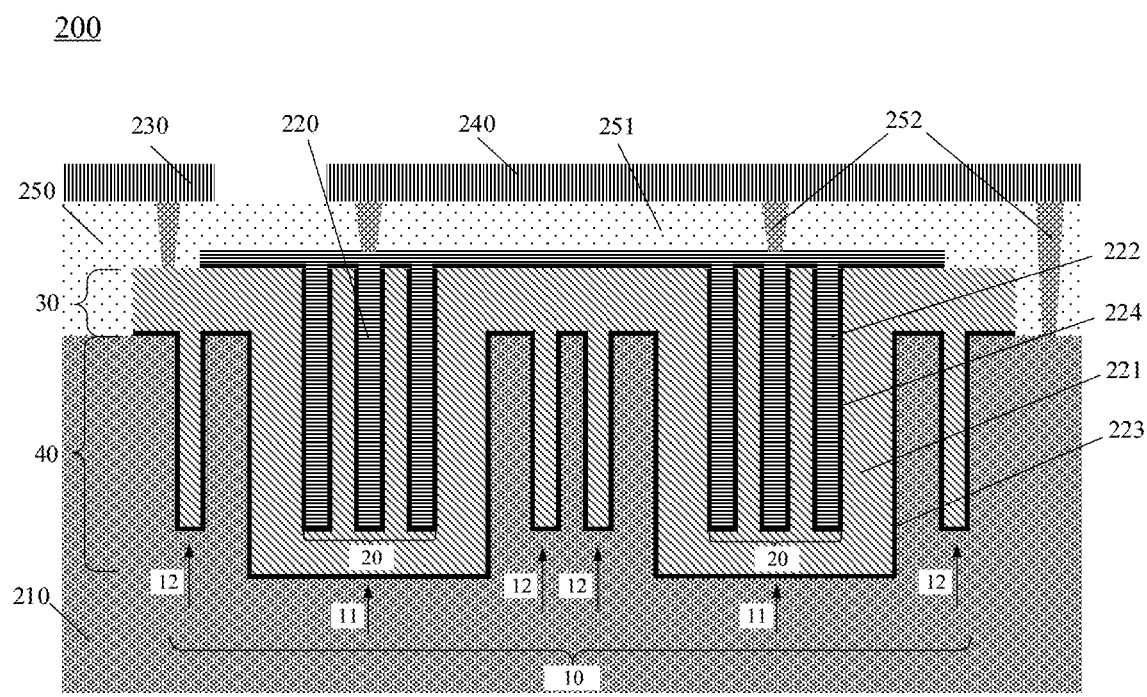
FIG. 5 is a schematic structural diagram of yet another capacitor according to an embodiment of the present disclosure.

Optionally, as shown in FIG. 5, the substrate trench group 10 further includes at least one second substrate trench 12 provided around the first substrate trench 11, and only the first conductive layer in the n conductive layers is disposed in the second substrate trench 12.

It should be noted that the first conductive layer is disposed in the second substrate trench 12 to increase a capacitance of a capacitor formed by the semiconductor substrate 210 and the first conductive layer 221.

Optionally, a size of the second substrate trench 12 is smaller than a size of the first substrate trench 11, and/or a depth of the second substrate trench 12 is smaller than a depth of the first substrate trench 11.

It should be noted that the second substrate trench 12 can be formed by etching simultaneously with the first substrate trench 11 to reduce etching processes.

Optionally, in the embodiment of the present disclosure, conductive layers in different laminated structures in the at least one laminated structure 220 may be in an electrically isolated state, as shown in FIGS. 2 and 3; and conductive layers in different laminated structures in the at least one laminated structure 220 may also be in an electrically connected state, as shown in FIGS. 4 and 5.

Optionally, in the embodiment of the present disclosure, the semiconductor substrate 210 is formed of a material with a resistivity less than a threshold, or a surface of the semiconductor substrate 210 is provided with a heavily doped conductive layer or conductive region with a resistivity less than a threshold. That is, the semiconductor substrate 210 is conductive, or a region in the semiconductor substrate 210 that is in contact with the laminated structure 220 is conductive.

It should be noted that if the semiconductor substrate 210 is formed of a material with a resistivity less than a threshold, it can be considered that the semiconductor substrate 210 is a heavily doped low-resistivity substrate; if a surface of the semiconductor substrate 210 is provided with a heavily doped conductive layer with a resistivity less than a threshold, it can be considered that the surface of the semiconductor substrate 210 is provided with a heavily doped low-resistivity conductive layer; and if a surface of the semiconductor substrate 210 is provided with a heavily doped conductive region with a resistivity less than a threshold, it can be considered that the surface of the semiconductor substrate 210 is provided with a heavily doped low-resistivity conductive region.

Figure 6:
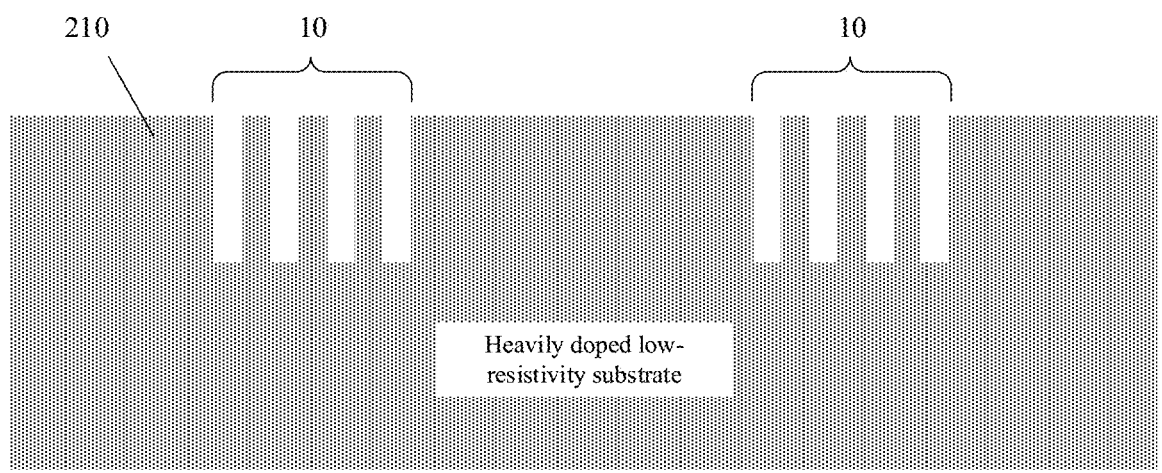
FIG. 6 is a schematic structural diagram of a semiconductor substrate according to an embodiment of the present disclosure.

For example, as shown in FIG. 6, the semiconductor substrate 210 is a heavily doped low-resistivity substrate, and the at least one substrate trench group 10 is disposed in the semiconductor substrate 210.

Figure 7:
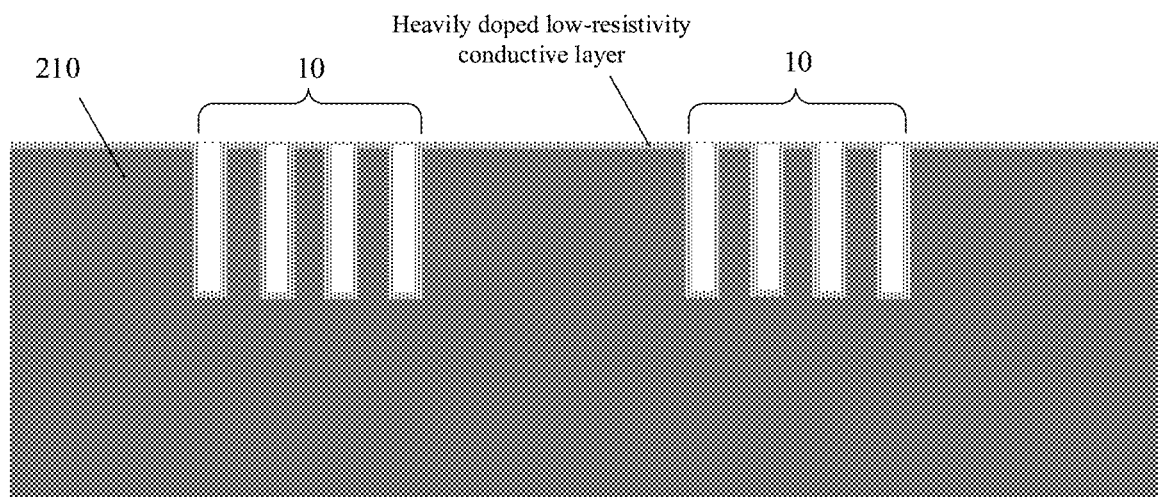
FIG. 7 is a schematic structural diagram of another semiconductor substrate according to an embodiment of the present disclosure.

For another example, as shown in FIG. 7, an upper surface of the semiconductor substrate 210 and an inner surface of the at least one substrate trench group 10 are provided with a heavily doped low-resistivity conductive layer.

Figure 8:
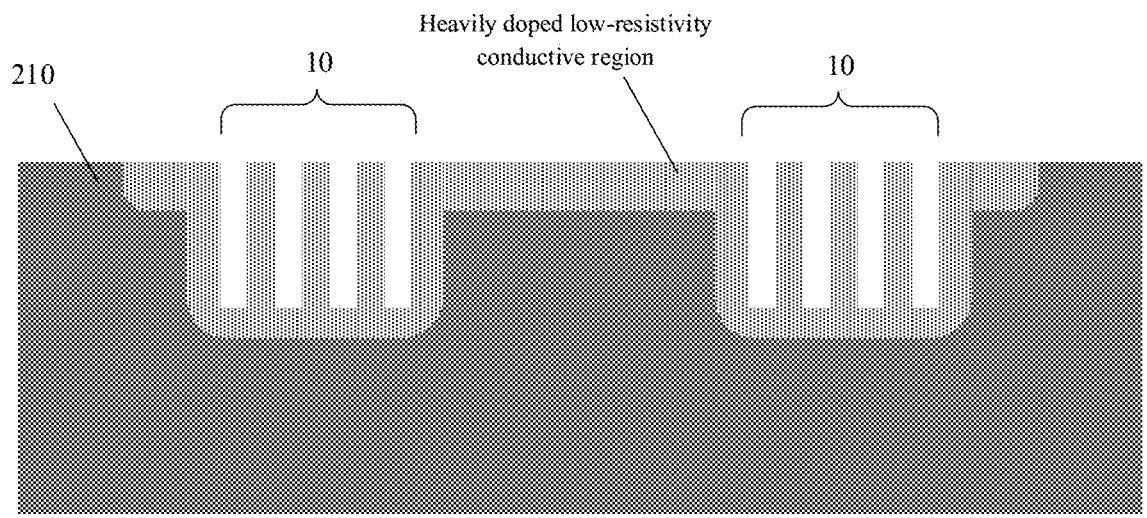
FIG. 8 is a schematic structural diagram of yet another semiconductor substrate according to an embodiment of the present disclosure.
Figure 9:
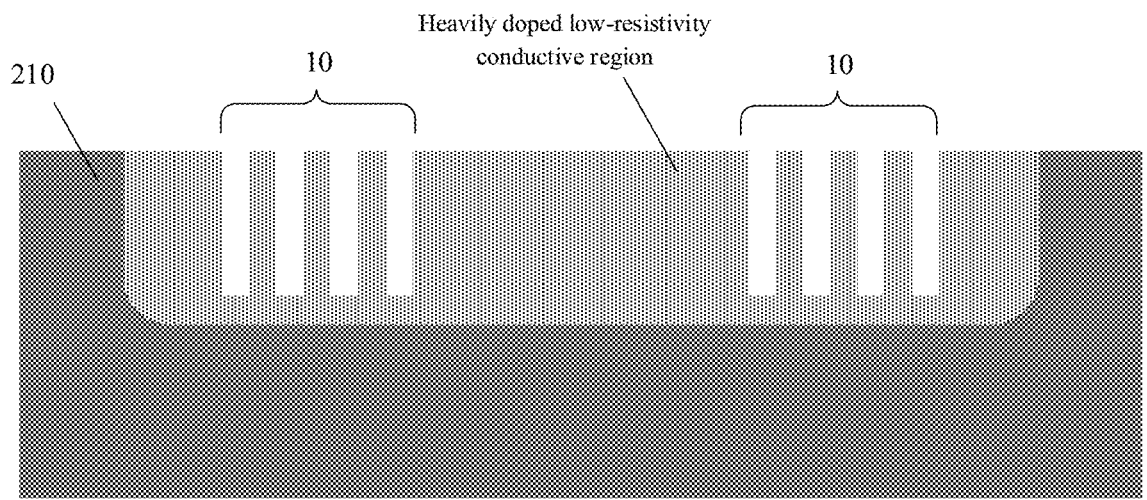
FIG. 9 is a schematic structural diagram of yet another semiconductor substrate according to an embodiment of the present disclosure.

For another example, as shown in FIGS. 8 and 9, a surface of the semiconductor substrate 210 is provided with a heavily doped low-resistivity conductive region, and the at least one substrate trench group 10 is disposed in the conductive region.

It should be noted that a material with a resistivity less than the threshold can be considered as a conductive material.

Optionally, if a conductive layer in the laminated structure 220 that is closest to the semiconductor substrate 210 is electrically connected to the first external electrode 230, the semiconductor substrate 210 is electrically connected to the second external electrode 240.

Optionally, if a conductive layer in the laminated structure 220 that is closest to the semiconductor substrate 210 is electrically connected to the second external electrode 240, the semiconductor substrate 210 is electrically connected to the first external electrode 230.

For example, as shown in FIGS. 2 to 5, a conductive layer in the laminated structure 220 that is closest to the semiconductor substrate 210 is electrically connected to the first external electrode 230, and the semiconductor substrate 210 is electrically connected to the second external electrode 240.

Optionally, in the embodiment of the present disclosure, the first external electrode 230 and/or the second external electrode 240 is electrically connected to a conductive layer in the n conductive layers through an interconnection structure 250.

Optionally, the interconnection structure 250 includes at least one insulating layer 251 and a conductive via structure 252, and the conductive via structure 252 penetrates through the at least one insulating layer 251 to be electrically connected to a conductive layer in the n conductive layers. As shown in FIGS. 2 to 5, the interconnection structure 250 is disposed above the laminated structure 220.

It should be noted that the at least one insulating layer 251 may also be referred to as an intermetal dielectric (IMD) layer or an interlayer dielectric (ILD) layer. The conductive via structure 252 may also be referred to as a conductive channel.

Optionally, the at least one insulating layer 251 covers the laminated structure 220, and the at least one insulating layer 251 can fill a cavity or gap formed in the laminated structure 220 to improve structural integrity and mechanical stability of a capacitor.

Optionally, a material of the at least one insulating layer 251 may be an organic polymer material, including polyimide), parylene, benzocyclobutene (BCB), or the like, or may be some inorganic materials, including spin on glass (SOG), undoped silicon glass (USG), boro-silicate glass (BSG), phospho-silicate glass (PSG), boro-phospho-silicate glass (BPSG), silicon oxide synthesized by tetraethyl orthosilicate (TEOS), silicon oxide, silicon nitride, or ceramic, or may also be a combination or laminated layer of the above materials.

Optionally, a material of the conductive via structure 252 may be made of a low-resistivity conductive material, such as heavily doped polysilicon, tungsten, Ti, TiN, Ta, or TaN.

It should be understood that a shape of the conductive via structure 252 and the number thereof may be specifically determined according to a manufacturing process of the capacitor 200, which is not limited in the embodiment of the present disclosure.

Figure 10:
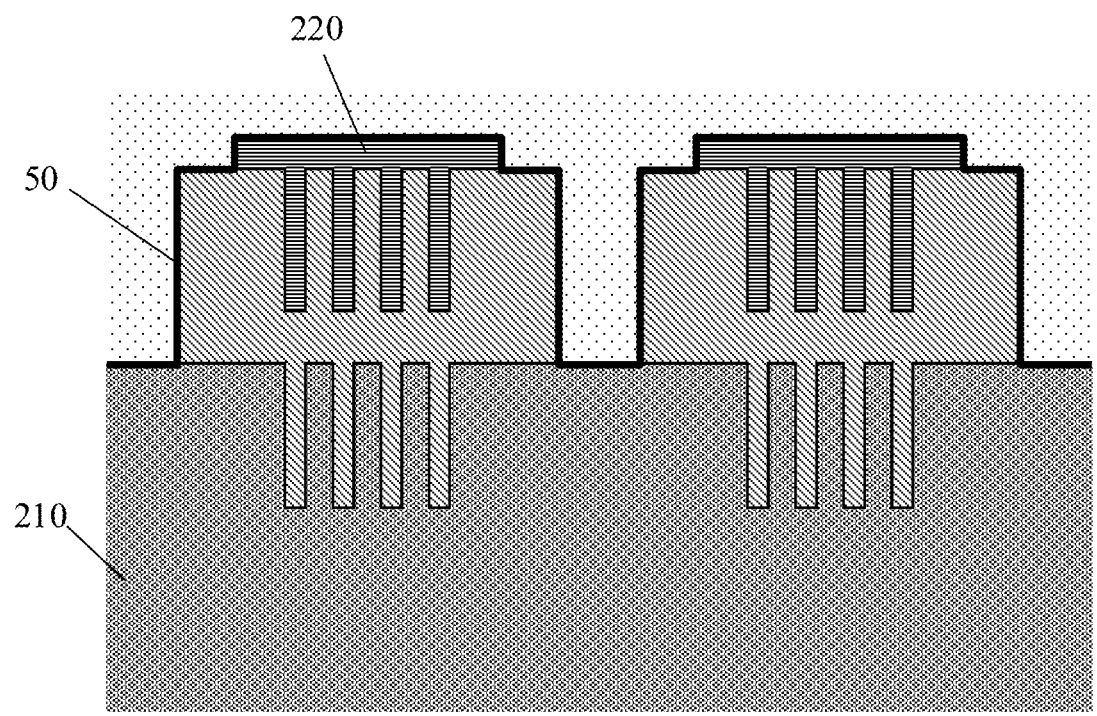
FIG. 10 is a schematic structural diagram of an etching stop layer according to an embodiment of the present disclosure.
Figure 11:
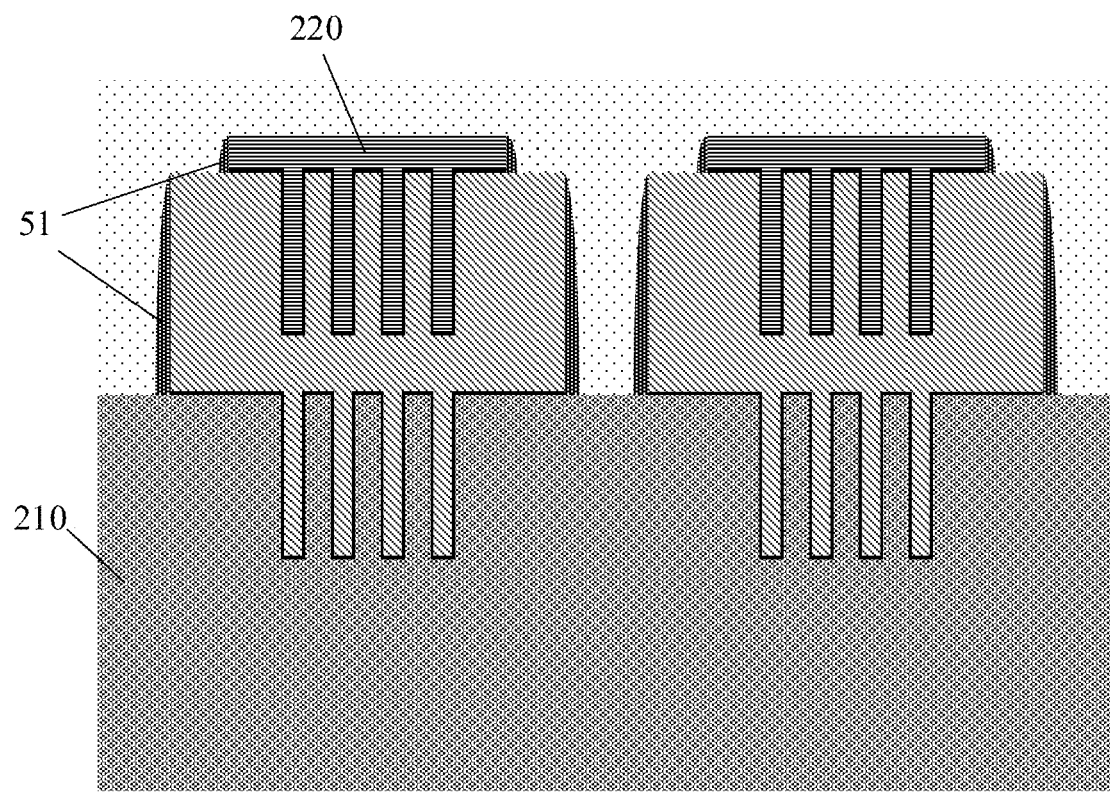
FIG. 11 is a schematic structural diagram of a spacer according to an embodiment of the present disclosure.

Optionally, in the embodiment of the present disclosure, the laminated structure 220 is provided with a step structure, and the step structure is provided with an etching stop layer 50 formed of an insulating material, as shown in FIG. 10, or an edge of the step structure is provided with a spacer 51 formed of an insulating material, as shown in FIG. 11.

Optionally, the etching stop layer 50 may be one of the aforementioned at least one insulating layer 251. The spacer 51 may be one or a part of the aforementioned at least one insulating layer 251.

It should be understood that the etching stop layer 50 is more resistant to etching than other insulating layers in the at least one insulating layer 251. When the conductive via structure 252 is etched, a bottom of the conductive via structure 252 may stay on the etching stop layer at different depths, and then part of the etching stop layer 50 exposed at the bottom of the conductive via structure 252 is removed by a dry or wet process, so that the conductive via structure 252 penetrates through the etching stop layer 50.

It should be noted that the etching stop layer 50 provided on the step structure can strengthen electrical insulation between adjacent conductive layers in the laminated structure 220, and strengthen electrical insulation between the first conductive layer in the laminated structure 220 and the semiconductor substrate 210. Similarly, the spacer 51 formed of the insulating material that is provided at the edge of the step structure can strengthen electrical insulation between adjacent conductive layers in the laminated structure 220, and strengthen electrical insulation between the first conductive layer in the laminated structure 220 and the semiconductor substrate 210.

Optionally, the etching stop layer 50 or the spacer 51 may be silicon oxide, silicon nitride, or silicon-containing glass such as an undoped silicon glass (USG), boro-silicate glass (BSG), phospho-silicate glass (PSG), boro-phospho-silicate glass (BPSG)) deposited by a chemical vapor deposition (CVD) process, or may also be alumina deposited by atomic layer deposition (ALD), or may be sprayed or spin-coated spin on glass (SOG), polyimide, or the like, or may further be a combination of the above materials.

Optionally, in some embodiments, the at least one first external electrode 230 and the at least one second external electrode 240 are disposed above the laminated structure 220. Optionally, the capacitor 200 further includes: an electrode layer disposed above the laminated structure 220, where the electrode layer includes at least one first conductive region and at least one second conductive region that are separated from each other, the first conductive region forms the first external electrode 230, and the second conductive region forms the second external electrode 240. Details are as shown in FIGS. 2 to 5. That is, the at least one first external electrode 230 and the at least one second external electrode 240 can be formed by one etching, which reduces etching steps.

Specifically, as shown in FIGS. 2 to 5, the electrode layer is disposed above the interconnection structure 250, the first external electrode 230 is electrically connected to the semiconductor substrate 210 and an even-numbered conductive layer in the laminated structure 220 through the conductive via structure 252, and the second external electrode 240 is electrically connected to an odd-numbered conductive layer in the laminated structure 220 through the conductive via structure 252.

Optionally, in the embodiment of the present disclosure, the semiconductor substrate 210 may not be provided with the at least one substrate trench group 10, that is, the first conductive layer in the n conductive layers is disposed above the semiconductor substrate 210, as shown in FIG. 12.

It should be understood that, except that the semiconductor substrate 210 is not provided with the at least one substrate trench group 10, the other settings in FIG. 12 are the same as those in FIG. 2. For the sake of brevity, details are not described herein again.

In the embodiment of the present disclosure, a trench capacitor is manufactured separately in a semiconductor substrate and a conductive layer, and a process of manufacturing a single capacitor can be reused, which reduces alignment accuracy requirements of a plurality of conductive layers, and can further improve capacitance density of the capacitor without increasing the process difficulty.

A capacitor according to an embodiment of the present disclosure is described above, and a method for manufacturing a capacitor according to an embodiment of the present disclosure is described below. The capacitor according to the foregoing embodiment of the present disclosure can be manufactured by the method for manufacturing the capacitor according to the embodiment of the present disclosure, and related descriptions in the following embodiments and the foregoing embodiments may refer to each other.

Hereinafter, a method for manufacturing a capacitor according to an embodiment of the present disclosure will be introduced in detail with reference to FIG. 13.

It should be understood that FIG. 13 is a schematic flow chart of a method for manufacturing a capacitor according to an embodiment of the present disclosure, but these steps or operations are merely examples, and other operations or variations of various operations in FIG. 13 may also be performed in the embodiment of the present disclosure.

FIG. 13 illustrates a schematic flow chart of a method 300 for manufacturing a capacitor according to an embodiment of the present disclosure. As shown in FIG. 13, the method 300 for manufacturing the capacitor includes:

step 310, producing at least one substrate trench group on a semiconductor substrate, the substrate trench group entering the semiconductor substrate downward from an upper surface of the semiconductor substrate;

step 320, producing at least one laminated structure, each laminated structure including n conductive layers and m dielectric layer(s), where the first conductive layer in the n conductive layers is disposed above the semiconductor substrate and in the substrate trench group, the i-th conductive layer in the n conductive layers is provided with the i-th conductive layer trench group, the (i+1)th conductive layer in the n conductive layers is disposed above the i-th conductive layer and in the i-th conductive layer trench group, and the n conductive layers and the m dielectric layer(s) form a structure that a conductive layer and a dielectric layer are adjacent to each other, where m, n, and i are positive integers, and n≥2, 1≤i≤n−1; and step 330, producing at least one first external electrode and at least one second external electrode, where the first external electrode is electrically connected to some conductive layer(s) in the n conductive layers, and the second external electrode is electrically connected to other conductive layer(s) in the n conductive layers, and a conductive layer in the laminated structure adjacent to each conductive layer in the some conductive layer(s) includes at least one conductive layer in the other conductive layer(s).

Specifically, the capacitors shown in FIGS. 2 to 5 can be manufactured based on the above steps 310-330.

It should be understood that an upper surface of each material layer in steps 310-330 refers to a surface of the material layer substantially parallel to the upper surface of the substrate, and an inner surface of the each material layer refers to an upper surface of the material layer in the trench. The upper surface and the inner surface may be regarded as a whole.

It should be noted that a depth of the substrate trench group 10 is less than a thickness of the semiconductor substrate 210. That is, the substrate trench group 10 does not penetrate through the semiconductor substrate 210.

Optionally, in the above step 310, photolithography and deep reactive ion etching processes may be used to produce the at least one substrate trench group 10 on the semiconductor substrate 210.

A substrate trench included in the substrate trench group 10 may be one or more of a via, a trench, a pillar, or a wall.

Figure 14A:
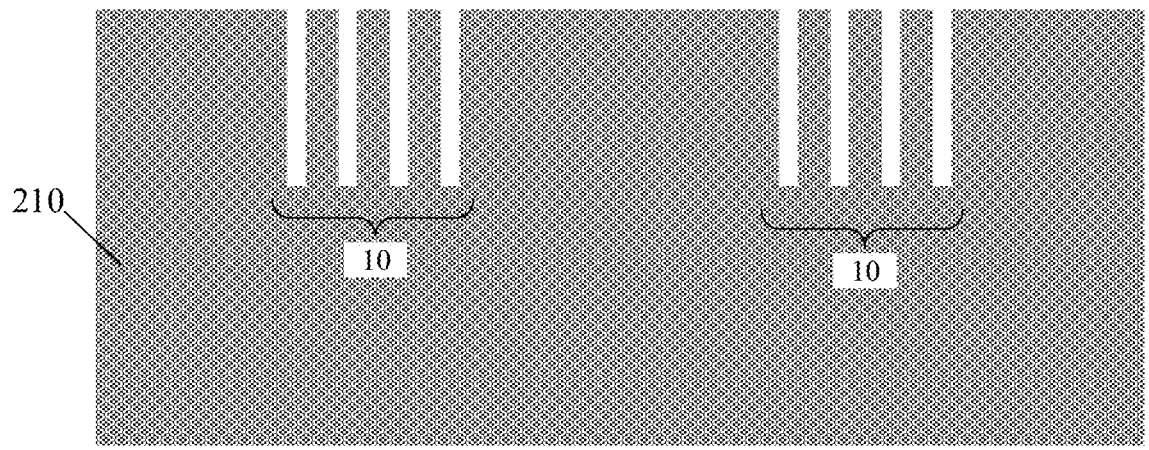
FIGS. 14a to 14n are schematic diagrams of a method for manufacturing a capacitor according to an embodiment of the present disclosure.
Figure 14B:
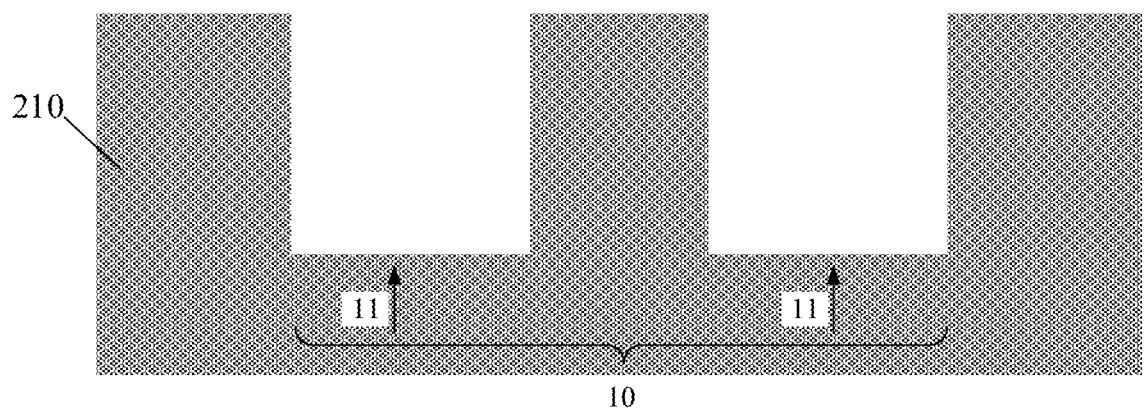
Figure 14C:
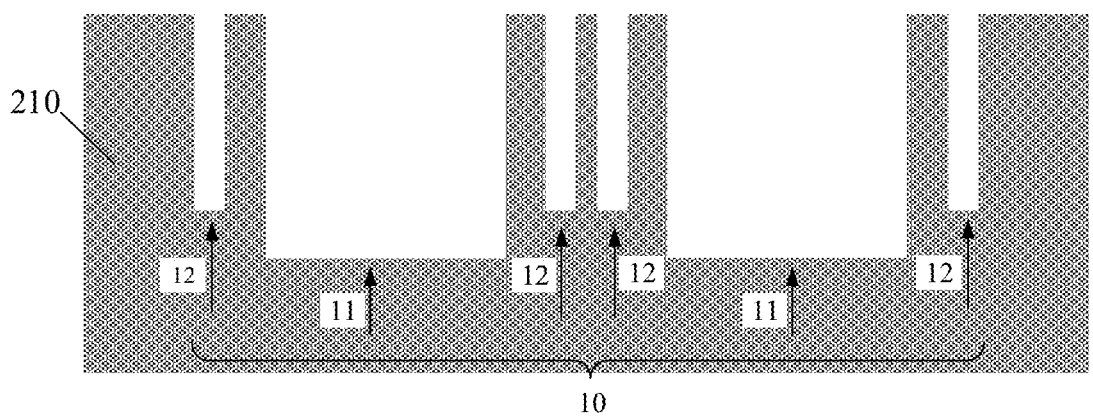

Optionally, in the above step 310, at least one substrate trench group 10 as shown in FIG. 14a may be produced on the semiconductor substrate 210, or at least one substrate trench group 10 as shown in FIG. 14b may be produced on the semiconductor substrate 210, or at least one substrate trench group 10 as shown in FIG. 14c may also be produced on the semiconductor substrate 210.

Optionally, a capacitor manufactured based on the at least one substrate trench group 10 shown in FIG. 14a (the capacitor 200 shown in FIGS. 2 and 3) may at least include but not be limited to the following features.

The i-th conductive layer includes a film layer portion 30 and a trench portion 40, and the i-th conductive layer trench group 20 is disposed in the film layer portion 30 of the i-th conductive layer and does not enter the trench portion 40 of the i-th conductive layer.

A thickness of a film layer portion of the first conductive layer ranges from 10 nm to 20 μm.

Numbers and/or sizes of conductive layer trenches included in different conductive layers in the n conductive layers are the same. Of course, numbers and/or sizes of conductive layer trenches included in different conductive layers in the n conductive layers may also be different.

A plurality of substrate trenches included in the substrate trench group 10 are distributed in an array, and/or a plurality of conductive layer trenches included in the i-th conductive layer trench group 20 are distributed in an array.

Sizes of the plurality of substrate trenches included in the substrate trench group 10 are smaller than a first threshold, and/or sizes of the plurality of conductive layer trenches included in the i-th conductive layer trench group 20 are smaller than a second threshold. For example, the first threshold may be 1 μm, and the second threshold may also be 1 μm.

Optionally, capacitors manufactured based on the at least one substrate trench group 10 shown in FIGS. 14b and 14c (the capacitor 200 shown in FIGS. 4 and 5) may at least include but not be limited to the following features.

The i-th conductive layer includes a film layer portion 30 and a trench portion 40, and the i-th conductive layer trench group 20 is disposed in the film layer portion 30 and the trench portion 40 of the i-th conductive layer.

The substrate trench group 10 includes at least one first substrate trench 11, and the second conductive layer in the n conductive layers is also disposed in the first substrate trench 11.

A size of the first substrate trench is greater than a third threshold, for example, the third threshold may be 100 nm.

The substrate trench group 10 further includes at least one second substrate trench 12 provided around the first substrate trench 11, and only the first conductive layer in the n conductive layers is disposed in the second substrate trench 12.

Optionally, the semiconductor substrate 210 is formed of a material with a resistivity less than a threshold, or a surface of the semiconductor substrate 210 is provided with a heavily doped conductive layer or conductive region with a resistivity less than a threshold. For example, the semiconductor substrate 210 may be as shown in FIGS. 6-9.

If a conductive layer in the laminated structure 220 that is closest to the semiconductor substrate 210 is electrically connected to the first external electrode 230, the semiconductor substrate 210 is electrically connected to the second external electrode 240.

If a conductive layer in the laminated structure 220 that is closest to the semiconductor substrate 210 is electrically connected to the second external electrode 240, the semiconductor substrate 210 is electrically connected to the first external electrode 230.

Hereinafter, description is made by an example that the semiconductor substrate 210 is formed of a material with a resistivity less than a threshold.

Optionally, the foregoing step 330 may specifically be: producing an electrode layer above the laminated structure 220, where the electrode layer includes at least one first conductive region and at least one second conductive region that are separated from each other, the first conductive region forms the first external electrode 230, and the second conductive region forms the second external electrode 240.

Optionally, the method 300 further includes:
producing an interconnection structure 250 so that the first external electrode 230 and/or the second external electrode 240 is electrically connected to a conductive layer in the n conductive layers through the interconnection structure 250.

Optionally, the interconnection structure 250 includes at least one insulating layer 251 and a conductive via structure 252, and the conductive via structure 252 penetrates through the at least one insulating layer 251 to be electrically connected to a conductive layer in the n conductive layers.

Optionally, the laminated structure 220 is provided with a step structure, and the step structure is provided with an etching stop layer 50 formed of an insulating material, as shown in FIG. 10, or an edge of the step structure is provided with a spacer 51 formed of an insulating material, as shown in FIG. 11. The etching stop layer 50 may be one of the aforementioned at least one insulating layer 251. The spacer 51 may be one or a part of the aforementioned at least one insulating layer 251.

Optionally, the first external electrode 230 is electrically connected to all odd-numbered conductive layer(s) in the n conductive layers, and the second external electrode 240 is electrically connected to all even-numbered conductive layer(s) in the n conductive layers.

Optionally, different laminated structures in the at least one laminated structure 220 share the same first external electrode 230, and/or different laminated structures share the same second external electrode 240.

Optionally, in the embodiment of the present disclosure, it is assumed that m=2 and n=2, that is, the laminated structure 220 includes: the first conductive layer 221, the second conductive layer 222, the first dielectric layer 223 and the second dielectric layer 224.

Specifically, in a case that the at least one substrate trench group 10 as shown in FIG. 14a is produced on the semiconductor substrate 210, the capacitor 200 as shown in FIG. 2 can be manufactured in the following manner.

Figure 14D:
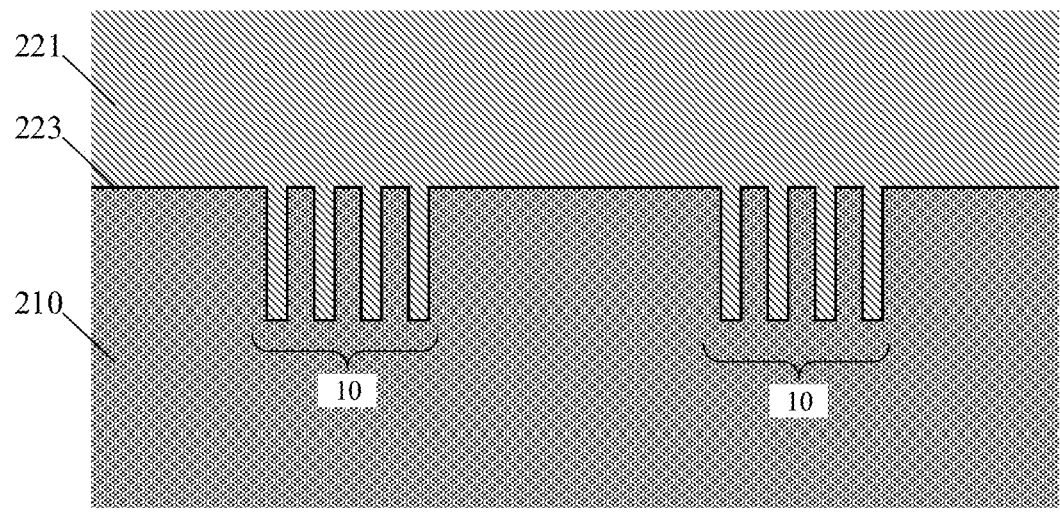
Figure 14E:
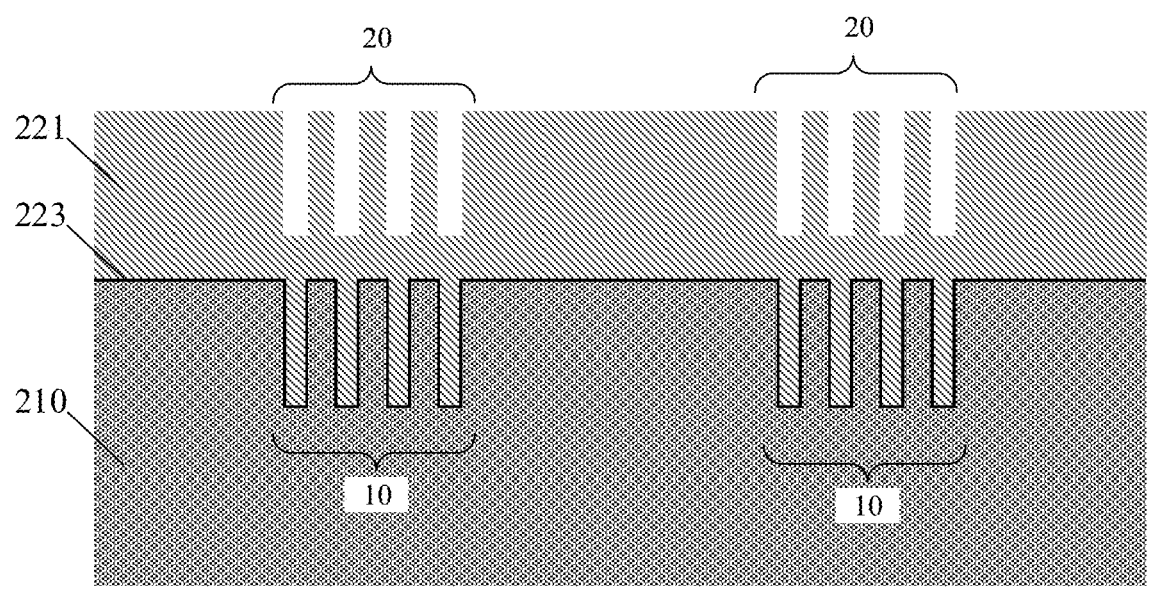
Figure 14F:
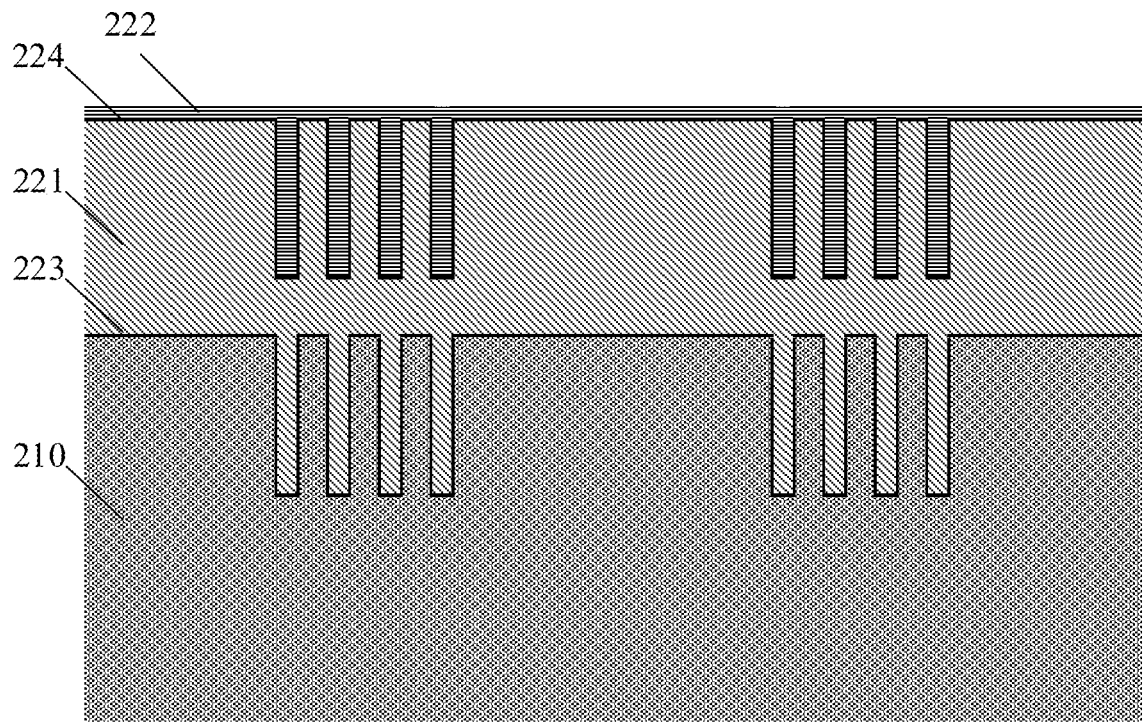
Figure 14G:
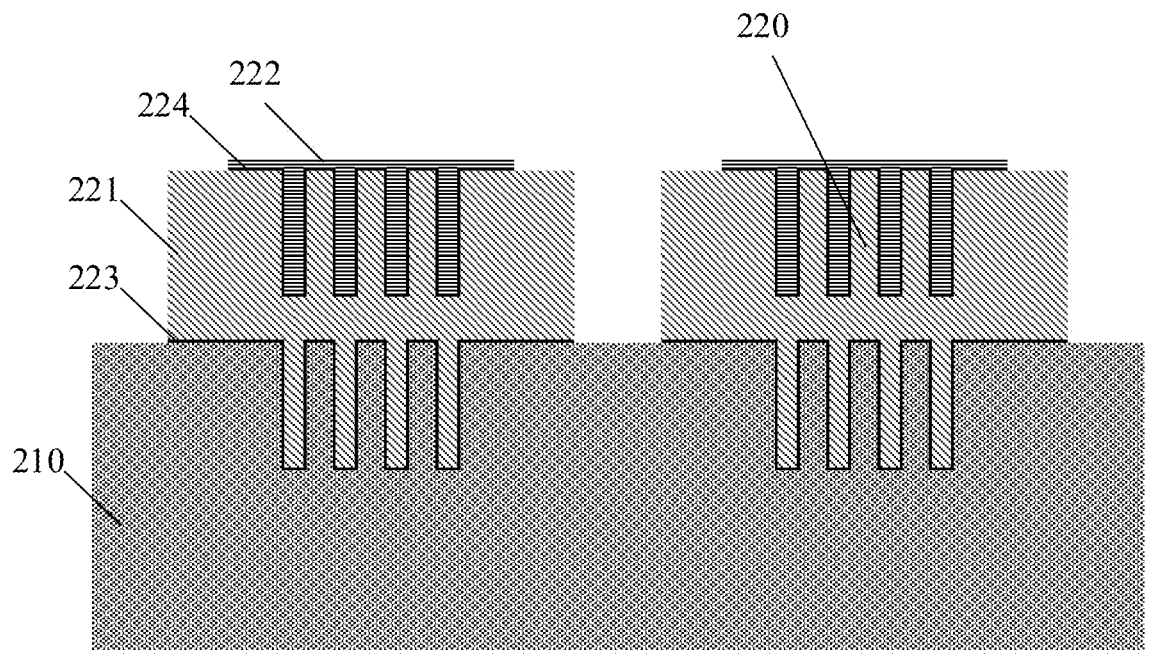
Figure 14H:
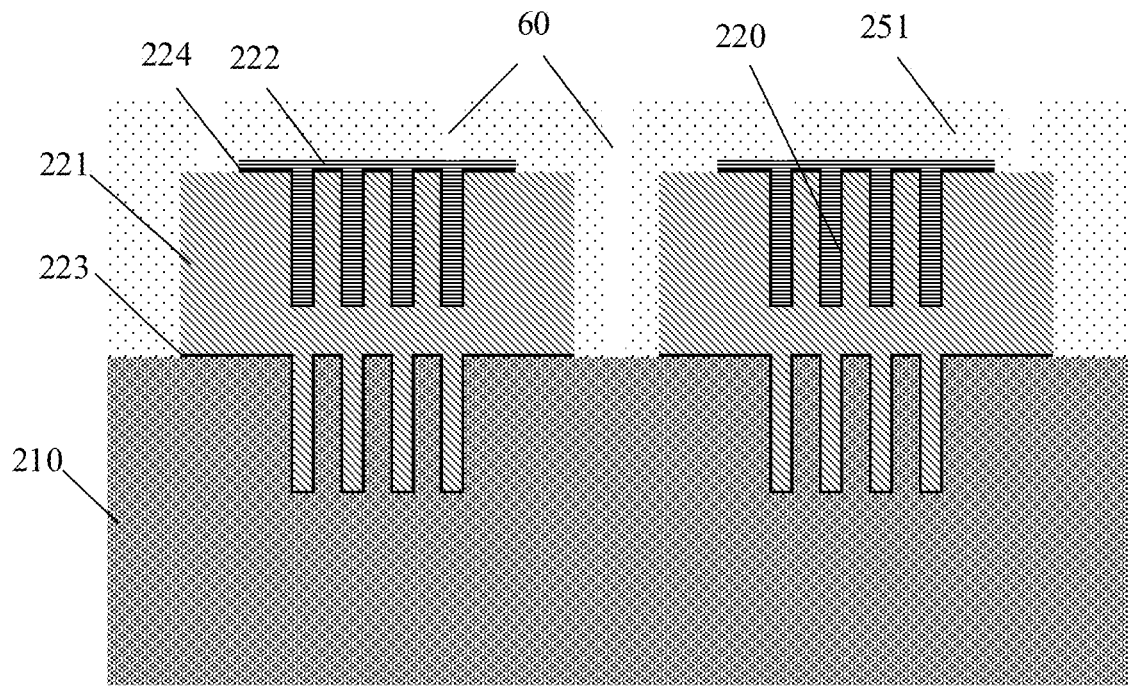
Figure 14I:
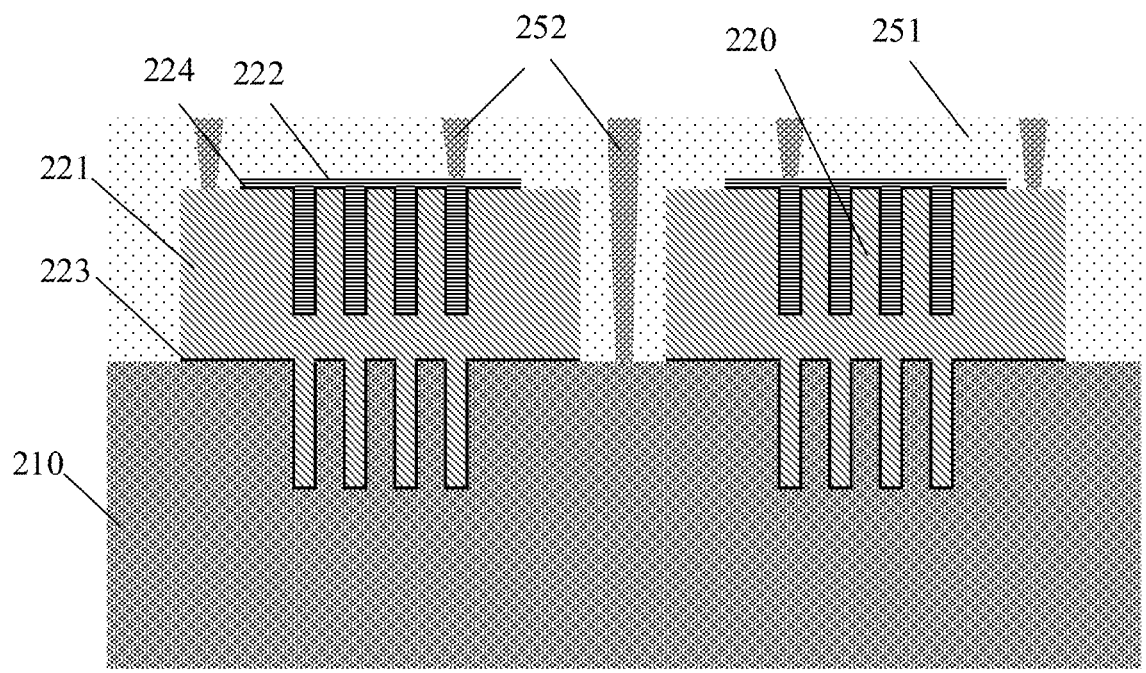

First, in the structure shown in FIG. 14a, the first dielectric layer 223 is deposited on the upper surface of the semiconductor substrate 210 and an inner surface of the substrate trench group 10, and then, the first conductive layer 221 is deposited on an upper surface and an inner surface of the first dielectric layer 223, as shown in FIG. 14d. Then, the first conductive layer 221 is etched to form a first conductive layer trench group 20 in the first conductive layer 221, and the first conductive layer trench group 20 is disposed in a film layer portion 30 of the first conductive layer 221 and does not enter a trench portion 40 of the first conductive layer 221, as shown in FIG. 14e. Then, the second dielectric layer 224 is deposited on an upper surface of the first conductive layer 221 and an inner surface of the first conductive layer trench group 20, and the second conductive layer 222 is deposited on an upper surface and an inner surface of the second dielectric layer 224, as shown in FIG. 14f. Then, a photolithography process is used to perform multi-step photolithography to form a step structure in the laminated structure 220, as shown in FIG. 14g. Then, an insulating layer 251 is deposited on the laminated structure 220, and the insulating layer 251 covers the laminated structure 220. Then, a photolithography process is used to provide a number of conductive vias 60 penetrating through the insulating layer 251 at positions corresponding to the semiconductor substrate 210, the first conductive layer 221, and the second conductive layer 222, as shown in FIG. 14h. And then a conductive material is deposited in the conductive vias 60 to form a conductive via structure 252, as shown in FIG. 14i. The insulating layer 251 and the conductive via structure 252 constitute the interconnection structure 250. Finally, an electrode layer is deposited on an upper surface of the interconnection structure 250, and a plurality of external electrodes are formed by photolithography, so that the capacitor 200 as shown in FIG. 2 is manufactured.

Specifically, in a case that the at least one substrate trench group 10 as shown in FIG. 14b is produced on the semiconductor substrate 210, the capacitor 200 as shown in FIG. 4 can be manufactured in the following manner.

Figure 14J:
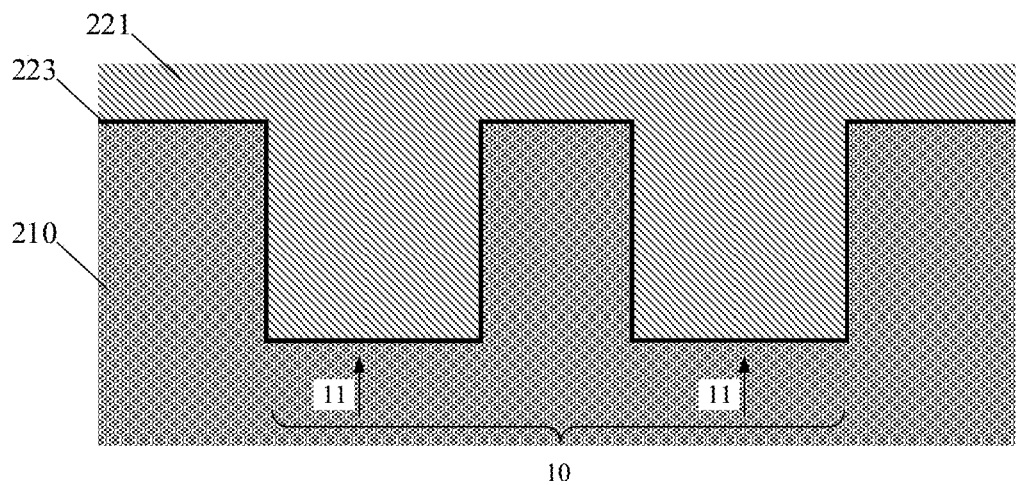
Figure 14K:
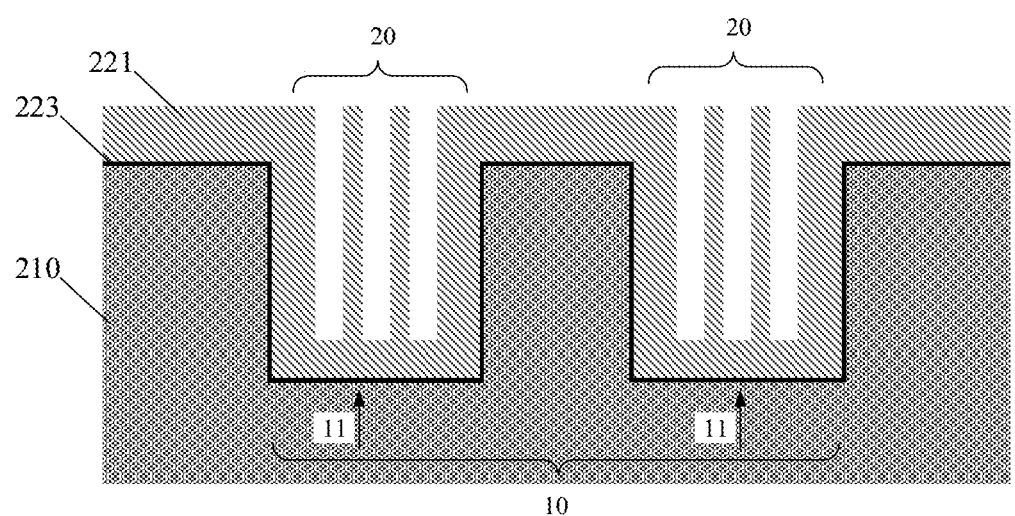
Figure 14L:
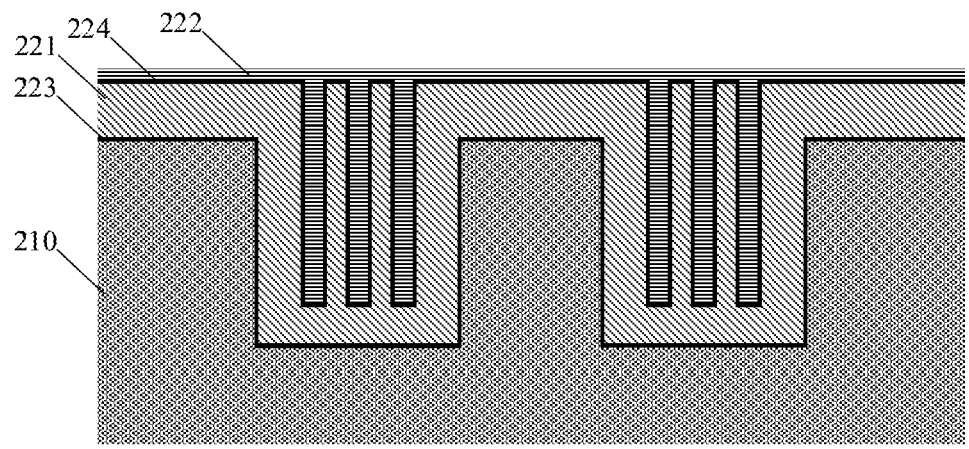
Figure 14M:
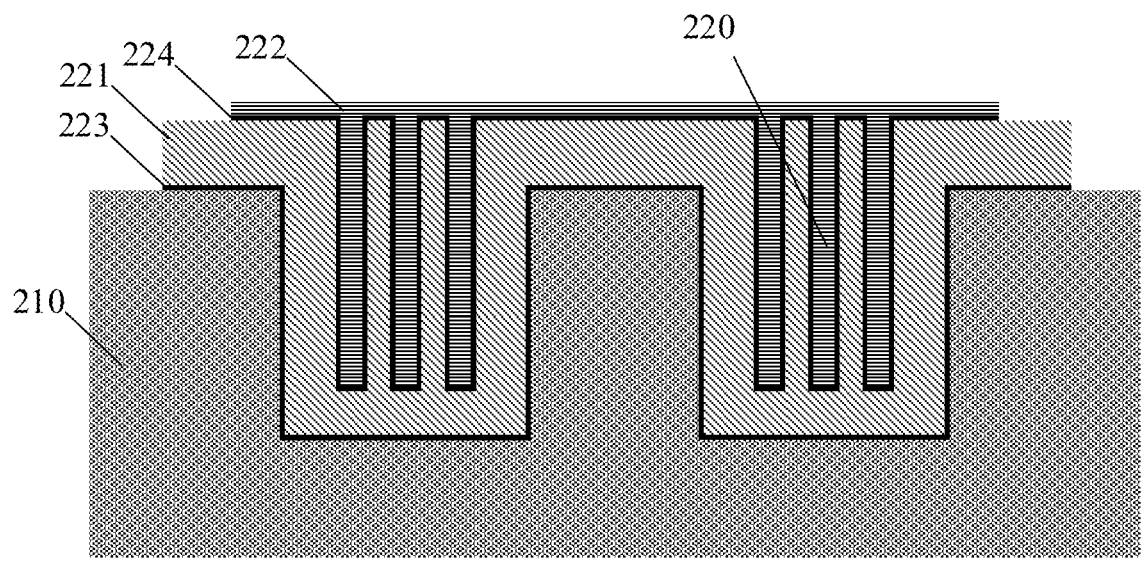
Figure 14N:
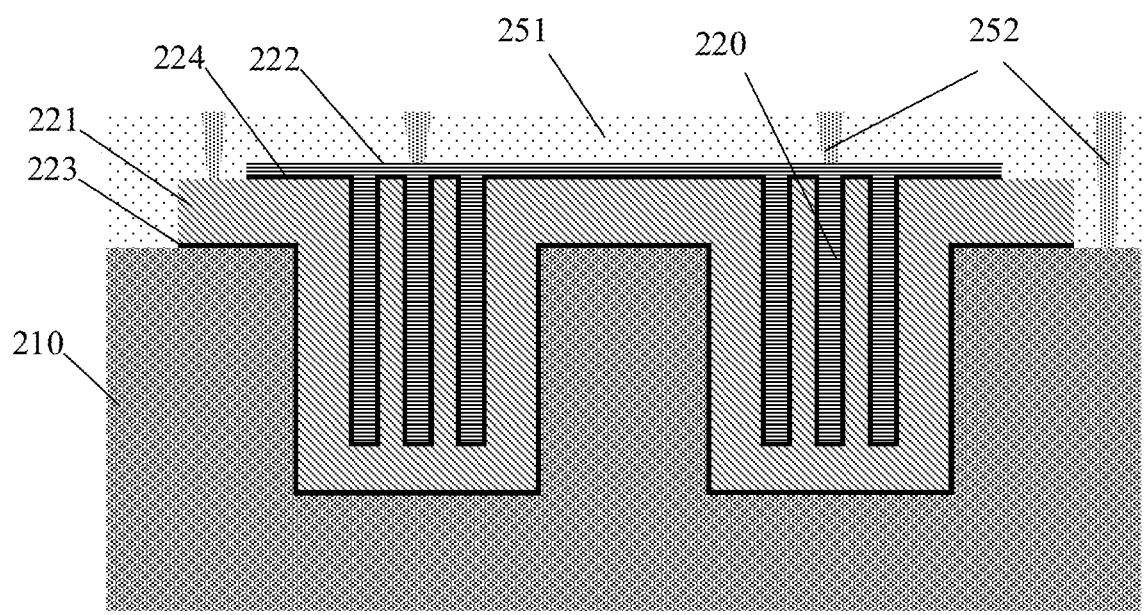

First, in the structure shown in FIG. 14b, the first dielectric layer 223 is deposited on the upper surface of the semiconductor substrate 210 and an inner surface of the substrate trench group 10, and then, the first conductive layer 221 is deposited on an upper surface and an inner surface of the first dielectric layer 223, as shown in FIG. 14j. Then, the first conductive layer 221 is etched to form a first conductive layer trench group 20 in the first conductive layer 221, and the first conductive layer trench group 20 is disposed in a film layer portion 30 and a trench portion 40 of the first conductive layer 221, as shown in FIG. 14k. Then, the second dielectric layer 224 is deposited on an upper surface of the first conductive layer 221 and an inner surface of the first conductive layer trench group 20, and the second conductive layer 222 is deposited on an upper surface and an inner surface of the second dielectric layer 224, as shown in FIG. 14l. Then, a photolithography process is used to perform multi-step photolithography to form a step structure in the laminated structure 220, as shown in FIG. 14m. Then, an insulating layer 251 is deposited on the laminated structure 220, and the insulating layer 251 covers the laminated structure 220. Then, a photolithography process is used to provide a number of conductive vias penetrating through the insulating layer 251 at positions corresponding to the semiconductor substrate 210, the first conductive layer 221, and the second conductive layer 222. And then a conductive material is deposited in the conductive vias to form a conductive via structure 252, and the insulating layer 251 and the conductive via structure 252 constitute the interconnection structure 250, as shown in FIG. 14n. Finally, an electrode layer is deposited on an upper surface of the interconnection structure 250, and a plurality of external electrodes are formed by photolithography, so that the capacitor 200 as shown in FIG. 4 is manufactured.

Specifically, in a case that the at least one substrate trench group 10 as shown in FIG. 14c is produced on the semiconductor substrate 210, the capacitor 200 as shown in FIG. 5 may be manufactured by referring to the method for manufacturing the capacitor 200 as shown in FIG. 4. For the sake of brevity, details are not described herein again.

Therefore, in a method for manufacturing a capacitor provided by an embodiment of the present disclosure, a trench capacitor is manufactured separately in a semiconductor substrate and a conductive layer, and a process of manufacturing a single capacitor can be reused, which reduces alignment accuracy requirements of a plurality of conductive layers, and can further improve capacitance density of the capacitor without increasing the process difficulty.

A method for manufacturing a capacitor according to the present disclosure is further described below in conjunction with a specific embodiment. For convenience of understanding, the capacitor as shown in FIG. 2 is manufactured in this embodiment. Of course, capacitors as shown in FIG. 3, FIG. 4, FIG. 5, and FIG. 12 may also be manufactured by using the method for manufacturing the capacitor in the embodiment, except that parts like settings of a trench structure and a semiconductor substrate are slightly different. For the sake of brevity, details are not described herein again.

Step 1: a semiconductor substrate is selected. Preferably, the semiconductor substrate is a silicon wafer, including monocrystalline silicon, polycrystalline silicon, or amorphous silicon, or may also use other semiconductor wafers, such as a III-V group compound semiconductor wafer formed of SiC, GaN, GaAs, or the like, or may further include an oxide layer or a bonding layer, such as a silicon-on-insulator (SOI) wafer.

Step 2, photolithography and deep reactive ion etching processes are used to produce a first trench array on the semiconductor substrate. The trench includes a via (Via), a trench, a pillar, or a wall.

Step 3: a surface of the first trench array is provided with a first capacitor, including a first electrode plate layer, a first dielectric layer and a second electrode plate layer. The first dielectric layer electrically isolates the first electrode plate layer and the second electrode plate layer.

First, the surface of the first trench array is provided with the first electrode plate layer. There are many specific implementation methods: doping can be performed on the surface of the first trench array to form a p++ type or n++ type of low-resistivity conductive region. Alternatively, a low-resistivity conductive material is deposited on the surface of the first trench array, for example, a metal such as TiN and/or TaN and/or Pt is deposited by an ALD process, or heavily doped polysilicon, metal tungsten, or a carbon material is deposited by a CVD process. In addition, it is also possible to directly select a heavily doped semiconductor substrate in step 1, or firstly form a heavily doped conductive region on a semiconductor substrate and then perform the photolithography and etching in step 2, then step 3 can be omitted.

Next, the first dielectric layer is provided on the first electrode plate layer.

Finally, the second electrode plate layer is deposited on the first dielectric layer. It should be noted that the second electrode plate layer fills the first trench array and forms a film layer with a certain thickness (between 10 nanometers and 20 microns) on the upper surface of the semiconductor substrate.

Step 4: a second trench array is produced on the second electrode plate layer by photolithography and deep reactive ion etching processes. A depth of the second trench array is less than a thickness of the second electrode plate layer on the surface of the semiconductor substrate.

Step 5: a surface of the second trench array is provided with a second capacitor, including the second electrode plate layer, a second dielectric layer and a third electrode plate layer.

It should be noted that the first dielectric layer and second dielectric layer may be a silicon oxide, a silicon nitride, a silicon oxynitride, a metal oxide, a metal nitride, or a metal oxynitride, for example, silicon dioxide, silicon nitride, SiON, or high dielectric constant materials, including $Al_2O_3$, $HfO_2$, $ZrO_2$, $TiO_2$, $Y_2O_3$, $La_2O_3$, $HfSiO_4$, $LaAlO_3$, $SrTiO_3$, $LaLuO_3$, or the like. The dielectric layer may be one layer or include a plurality of laminated layers, and may be one material or a combination of a plurality of materials.

Preferably, the second plate layer and third electrode plate layer are heavily doped polysilicon deposited by a CVD process, or may also be a laminated combination of a low-resistivity conductive material and other materials. The low-resistivity conductive material includes a carbon material, or various metals such as aluminum (Al), tungsten (W), copper (Cu), titanium (Ti), tantalum (Ta), platinum (Pt), ruthenium (Ru), iridium (Ir), or rhodium (Rh), and may also be a low-resistivity compound such as titanium nitride or tantalum nitride. The deposition method includes ALD, CVD, physical vapor deposition (PVD), electroplating, or the like.

Step 6: an interconnection structure and electrodes are produced to connect the first capacitor and the second capacitor in parallel. At least one electrode is electrically connected to the first plate layer and third electrode plate layer, and at least one electrode is electrically connected to the second electrode plate layer.

It should be noted that the interconnection structure includes at least one layer of insulating material as an interlayer dielectric (ILD) layer. In some cases, the deposited insulating material may also be used as an etching stop layer, or used to produce a spacer at an edge of a step to strengthen electrical insulation between adjacent electrode plate layers. The insulating material may be silicon oxide, silicon nitride, or silicon-containing glass (USG, BSG, PSG, BPSG) deposited by a CVD process, or may also be alumina deposited by ALD, or may be sprayed or spin-coated SOG, polyimide, or the like.

A person skilled in the art can understand that preferred embodiments of the present disclosure are described in detail above with reference to the accompanying drawings. However, the present disclosure is not limited to specific details in the foregoing embodiments. Within the technical concept of the present disclosure, the technical solution of the present disclosure may carry out a variety of simple variants, all of which are within the scope of protection of the present disclosure.

In addition, it should be noted that various specific technical features described in the foregoing specific embodiments may be combined in any suitable manner under the condition of no contradiction. In order to avoid unnecessary repetition, various possible combination ways will not be separately described in the present disclosure.

In addition, any combination of various different embodiments of the present disclosure may also be made as long as it does not contradict the idea of the present disclosure, and should also be regarded as the content of the present disclosure.

What is claimed is:

1. A capacitor, comprising:
   a semiconductor substrate comprising at least one substrate trench group, the substrate trench group entering the semiconductor substrate downward from an upper surface of the semiconductor substrate;
   at least one laminated structure, each laminated structure comprising n conductive layers and m dielectric layer(s), wherein the first conductive layer in the n conductive layers is disposed above the semiconductor substrate and in the substrate trench group, the i-th conductive layer in the n conductive layers is provided with the i-th conductive layer trench group, the (i+1)th conductive layer in the n conductive layers is disposed above the i-th conductive layer and in the i-th conductive layer trench group, and the n conductive layers and the m dielectric layer(s) form a structure that a conductive layer and a dielectric layer are adjacent to each other, where m, n, and i are positive integers, and n≥2, 1≤i≤n−1;
   at least one first external electrode, wherein the first external electrode is electrically connected to some conductive layer(s) in the n conductive layers; and
   at least one second external electrode, wherein the second external electrode is electrically connected to other conductive layer(s) in the n conductive layers, and a conductive layer in the laminated structure adjacent to each conductive layer in the some conductive layer(s) comprises at least one conductive layer in the other conductive layer(s);
   wherein the each laminated structure comprises the first conductive layer of the n conductive layers, a second conductive layer of the n conductive layers, a first dielectric layer of the m dielectric layers, and a second dielectric layer of the m dielectric layers, wherein
   the first dielectric layer is disposed between the semiconductor substrate and the first conductive layer, and the second dielectric layer is disposed between the first conductive layer and the second conductive layer; and
   the first conductive layer comprises a film layer portion and a trench portion, the first conductive layer is provided with a first conductive layer trench group, and the first conductive layer trench group is disposed in the film layer portion of the first conductive layer and does not enter the trench portion of the first conductive layer, and the second conductive layer is disposed above the first conductive layer and in the first conductive layer trench group; and
   the trench portion of the first conductive layer is disposed in the substrate trench group and the substrate trench group is completely filled by the trench portion, the film layer portion of the first conductive layer is disposed above the semiconductor substrate and the first conductive layer trench group in the film layer portion is disposed above the semiconductor substrate.

2. The capacitor according to claim 1, wherein the i-th conductive layer comprises an i-th film layer portion and an i-th trench portion, and the i-th conductive layer trench group is disposed in the i-th film layer portion of the i-th conductive layer and does not enter the trench portion of the i-th conductive layer.

3. The capacitor according to claim 2, wherein a thickness of the film layer portion of the first conductive layer ranges from 10 nm to 20 μm.

4. The capacitor according to claim 2, wherein numbers and/or sizes of conductive layer trenches comprised in different conductive layers in the n conductive layers are the same or different.

5. The capacitor according to claim 2, wherein a plurality of substrate trenches comprised in the substrate trench group are distributed in an array, and/or a plurality of conductive layer trenches comprised in the i-th conductive layer trench group are distributed in an array.

6. The capacitor according to claim 2, wherein sizes of a plurality of substrate trenches comprised in the substrate trench group are smaller than a first threshold, and/or sizes of a plurality of conductive layer trenches comprised in the i-th conductive layer trench group are smaller than a second threshold, wherein the first threshold is equal to the second threshold.

7. The capacitor according to claim 1, wherein the each laminated structure further comprises a third conductive layer of the n conductive layers, and a third dielectric layer of the m dielectric layers, wherein
   the third dielectric layer is disposed between the second conductive layer and the third conductive layer;
   the second conductive layer comprises a second film layer portion and a second trench portion, the second conductive layer is provided with a second conductive layer trench group, and the second conductive layer trench group is disposed in the second film layer portion of the second conductive layer and does not enter the second trench portion of the second conductive layer, and the third conductive layer is disposed above the second conductive layer and in the second conductive layer trench group;
   the second trench portion of the second conductive layer is disposed in the first conductive layer trench group and the first conductive layer trench group is completely filled by the second trench portion of the second conductive layer, the second film layer portion of the second conductive layer is disposed above the film layer portion of the first conductive layer and the second conductive layer trench group in the second film layer portion of the second conductive layer is disposed above the film layer portion of the first conductive layer; and
   numbers and sizes of substrate trenches in the substrate trench group are the same as numbers and sizes of second conductive layer trenches in the second conductive layer trench group.

8. The capacitor according to claim 1, wherein the laminated structure is provided with a step structure, and the step structure is provided with an etching stop layer formed of an insulating material, or an edge of the step structure is provided with a spacer formed of an insulating material.

9. The capacitor according to claim 1, wherein the semiconductor substrate is formed of a material with a resistivity less than a threshold, or a surface of the semiconductor substrate is provided with a heavily doped conductive layer or conductive region with a resistivity less than a threshold; and
   a conductive layer in the laminated structure that is closest to the semiconductor substrate is electrically connected to the first external electrode, and the semiconductor substrate is electrically connected to the second external electrode; or a conductive layer in the laminated structure that is closest to the semiconductor substrate is electrically connected to the second external electrode, and the semiconductor substrate is electrically connected to the first external electrode.

10. The capacitor according to claim 1, wherein the capacitor further comprises: an electrode layer disposed above the laminated structure, wherein the electrode layer comprises at least one first conductive region and at least one second conductive region that are separated from each other, the first conductive region forms the first external electrode, and the second conductive region forms the second external electrode;
the first external electrode and/or the second external electrode is electrically connected to a conductive layer in the n conductive layers through an interconnection structure, the interconnection structure comprises at least one insulating layer and a conductive via structure, and the conductive via structure penetrates through the at least one insulating layer to be electrically connected to a conductive layer in the n conductive layers.

11. The capacitor according to claim 1, wherein the first external electrode is electrically connected to all odd-numbered conductive layers in the n conductive layers, and the second external electrode is electrically connected to all even-numbered conductive layers in the n conductive layers, different laminated structures of the at least one laminated structure share the same first external electrode, and different laminated structures of the at least one laminated structure share the same second external electrode.

12. The capacitor according to claim 1, wherein the conductive layer comprises at least one of:
a heavily doped polysilicon layer, a metal silicide layer, a carbon layer, a conductive polymer layer, an aluminum layer, a copper layer, a tungsten layer, a titanium layer, a tantalum layer, a platinum layer, a nickel layer, a ruthenium layer, an iridium layer, a rhodium layer, a tantalum nitride layer, a titanium nitride layer, a titanium aluminum nitride layer, a tantalum silicon nitride layer, or a tantalum carbon nitride layer; and
the dielectric layer comprises at least one of:
a silicon oxide layer, a silicon nitride layer, a silicon oxynitride layer, a metal oxide layer, a metal nitride layer, or a metal oxynitride layer.

13. A method for manufacturing a capacitor, comprising:
producing at least one substrate trench group on a semiconductor substrate, the substrate trench group entering the semiconductor substrate downward from an upper surface of the semiconductor substrate;
producing at least one laminated structure, each laminated structure comprising n conductive layers and m dielectric layers, wherein the first conductive layer in the n conductive layers is disposed above the semiconductor substrate and in the substrate trench group, the i-th conductive layer in the n conductive layers is provided with the i-th conductive layer trench group, the (i+1)th conductive layer in the n conductive layers is disposed above the i-th conductive layer and in the i-th conductive layer trench group, and the n conductive layers and the m dielectric layers form a structure that a conductive layer and a dielectric layer are adjacent to each other, where m, n, and i are positive integers, and n≥2, 1≤i≤n−1; and
producing at least one first external electrode and at least one second external electrode, wherein the first external electrode is electrically connected to some conductive layers in the n conductive layers, and the second external electrode is electrically connected to other conductive layers in the n conductive layers, and a conductive layer in the laminated structure adjacent to each conductive layer in the some conductive layers comprises at least one conductive layer in the other conductive layers;
wherein the each laminated structure comprises the first conductive layer of the n conductive layers, a second conductive layer of the n conductive layers, a first dielectric layer of the m dielectric layers, and a second dielectric layer of the m dielectric layers, wherein
the first dielectric layer is disposed between the semiconductor substrate and the first conductive layer, and the second dielectric layer is disposed between the first conductive layer and the second conductive layer; and
the first conductive layer comprises a film layer portion and a trench portion, the first conductive layer is provided with a first conductive layer trench group, and the first conductive layer trench group is disposed in the film layer portion of the first conductive layer and does not enter the trench portion of the first conductive layer, and the second conductive layer is disposed above the first conductive layer and in the first conductive layer trench group; and
the trench portion of the first conductive layer is disposed in the substrate trench group and the substrate trench group is completely filled by the trench portion, the film layer portion of the first conductive layer is disposed above the semiconductor substrate and the first conductive layer trench group in the film layer portion is disposed above the semiconductor substrate.

14. The capacitor according to claim 1, wherein numbers and sizes of substrate trenches in the substrate trench group are the same as numbers and sizes of first conductive layer trenches in the first conductive layer trench group.

15. The capacitor according to claim 8, wherein a plurality of the first conductive layer trench groups is disposed horizontally in the film layer portion of the first conductive layer, an insulating trench is disposed between adjacent first conductive layer trench groups to from the step structure of the laminated structure;
wherein an etching stop layer formed of an insulating material is disposed on surface of the insulating trench, or a spacer formed of an insulating material is disposed on sidewall of the insulating trench.

16. The method for manufacturing a capacitor according to claim 13, wherein numbers and sizes of substrate trenches in the substrate trench group are the same as numbers and sizes of first conductive layer trenches in the first conductive layer trench group.

17. The method for manufacturing a capacitor according to claim 13, wherein the each laminated structure further comprises a third conductive layer of the n conductive layers and a third dielectric layer of the m dielectric layers, wherein
the third dielectric layer is disposed between the second conductive layer and the third conductive layer;
the second conductive layer comprises a second film layer portion and a second trench portion, the second conductive layer is provided with a second conductive layer trench group, and the second conductive layer trench group is disposed in the second film layer portion of the second conductive layer and does not enter the second trench portion of the second conductive layer, and the third conductive layer is disposed above the second conductive layer and in the second conductive layer trench group;

the second trench portion of the second conductive layer is disposed in the first conductive layer trench group and the first conductive layer trench group is completely filled by the second trench portion of the second conductive layer, the second film layer portion of the second conductive layer is disposed above the film layer portion of the first conductive layer and the second conductive layer trench group in the second film layer portion of the second conductive layer is disposed above the film layer portion of the first conductive layer; and numbers and sizes of substrate trenches in the substrate trench group are the same as numbers and sizes of second conductive layer trenches in the second conductive layer trench group.

18. The method for manufacturing a capacitor according to claim 13, wherein a plurality of the first conductive layer trench groups is disposed horizontally in the film layer portion of the first conductive layer, an insulating trench is disposed between adjacent first conductive layer trench groups to from a step structure of the laminated structure;

wherein an etching stop layer formed of an insulating material is disposed on surface of the insulating trench, or a spacer formed of an insulating material is disposed on sidewall of the insulating trench.

* * * * *